United States Patent
Cote et al.

(10) Patent No.: US 6,725,442 B1
(45) Date of Patent: Apr. 20, 2004

(54) SCALABLE AND PARALLEL PROCESSING METHODS AND STRUCTURES FOR TESTING CONFIGURABLE INTERCONNECT NETWORK IN FPGA DEVICE

(75) Inventors: Richard T. Cote, Fremont, CA (US); Brenda Nguyen, San Jose, CA (US); Xuan D. Pham, San Jose, CA (US); Bradley A. Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 38 days.

(21) Appl. No.: 10/235,380

(22) Filed: Sep. 4, 2002

Related U.S. Application Data

(62) Division of application No. 09/692,694, filed on Oct. 18, 2000, now Pat. No. 6,470,485.

(51) Int. Cl.[7] .............................................. G06F 17/50
(52) U.S. Cl. ................................. 716/16; 716/1; 716/4; 716/5; 716/17
(58) Field of Search ................................. 716/16, 17, 1, 716/4, 5

(56) References Cited

U.S. PATENT DOCUMENTS

| | | | | |
|---|---|---|---|---|
| 5,212,652 A | * | 5/1993 | Agrawal et al. | 326/41 |
| 5,621,650 A | * | 4/1997 | Agrawal et al. | 716/16 |
| 6,097,212 A | * | 8/2000 | Agrawal et al. | 326/41 |
| 6,127,843 A | * | 10/2000 | Agrawal et al. | 326/40 |
| 6,154,051 A | * | 11/2000 | Nguyen et al. | 326/41 |
| 6,470,485 B1 | * | 10/2002 | Cote et al. | 716/16 |

OTHER PUBLICATIONS

Huang et al., "On the Diagnosis of Programmable Interconnect System: Theory and Application" Apr., 1996, IEEE Proceedings of 14th VLSITest Symposium, pp. 204–209.*

* cited by examiner

Primary Examiner—Leigh M. Garbowski
Assistant Examiner—Sun James Lin

(57) ABSTRACT

Configurable interconnect resources of field programmable gate arrays (FPGA's) are tested by configuring at least some of the lookup tables (LUT's), registers and input signal acquirers to implement one or more sequential state machines that feed back their current states via at least some of the interconnect conductors to the inputs of the LUT's. The fedback signals are decoded by the LUT's for defining next-states of the one or more sequential state machines. Each sequential state machine may be programmed to sequentially step through a number of unique states, where the unique states challenge capabilities of the interconnect conductors to toggle through combinations of different signal levels. The sequential state machines are exercised to sequentially step through plural ones of their unique states. At least one of the stepped-into states is sensed and analyzed after a predefined number of steps have been taken in order to determine whether the detected state matches the expected state for the predefined number of steps. If it does not, that is taken to indicate that a defect exists in the under-test FPGA. Plural sequential state machines can be exercised in parallel within a given FPGA so that large numbers of interconnect resources can be simultaneously challenged.

14 Claims, 10 Drawing Sheets

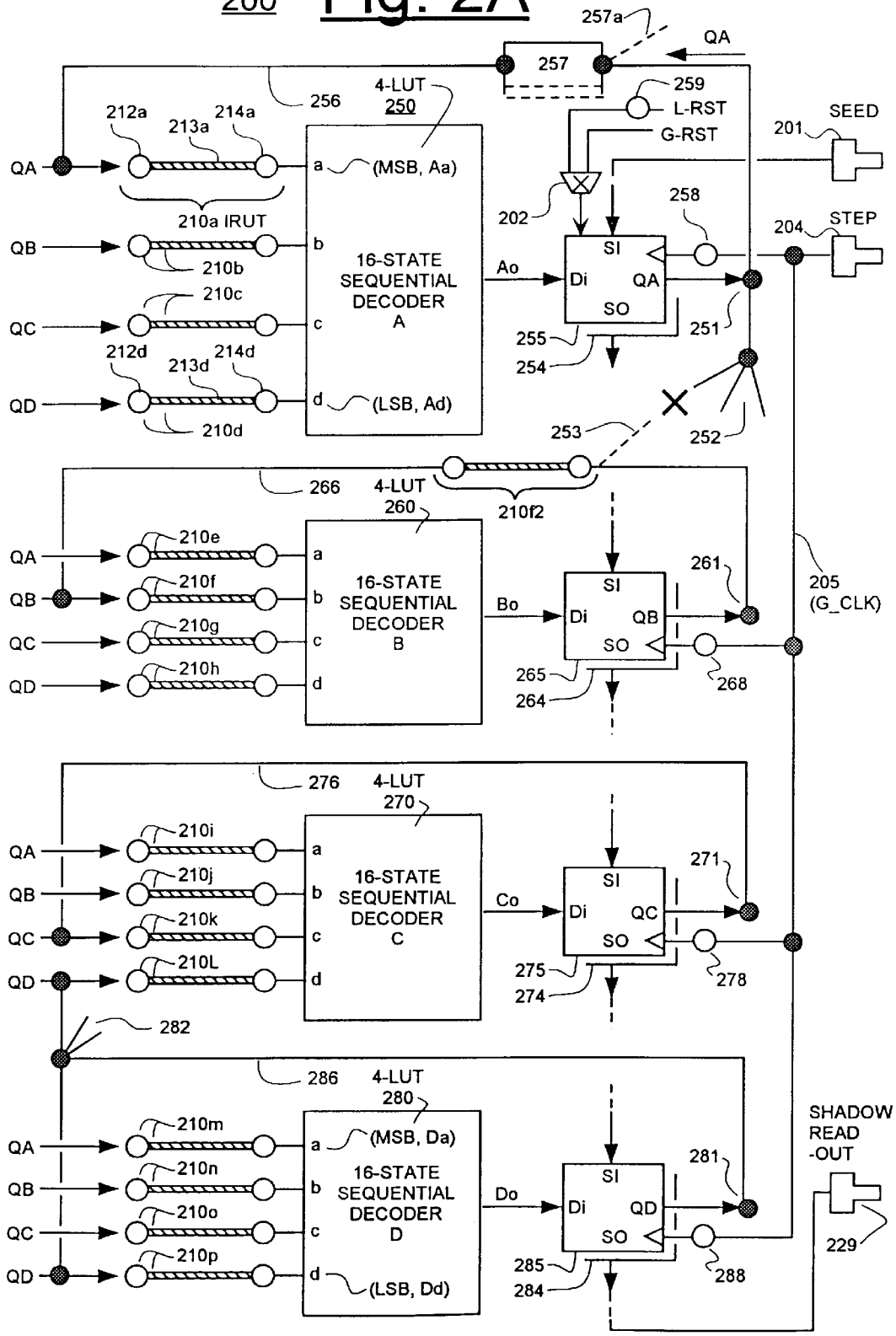

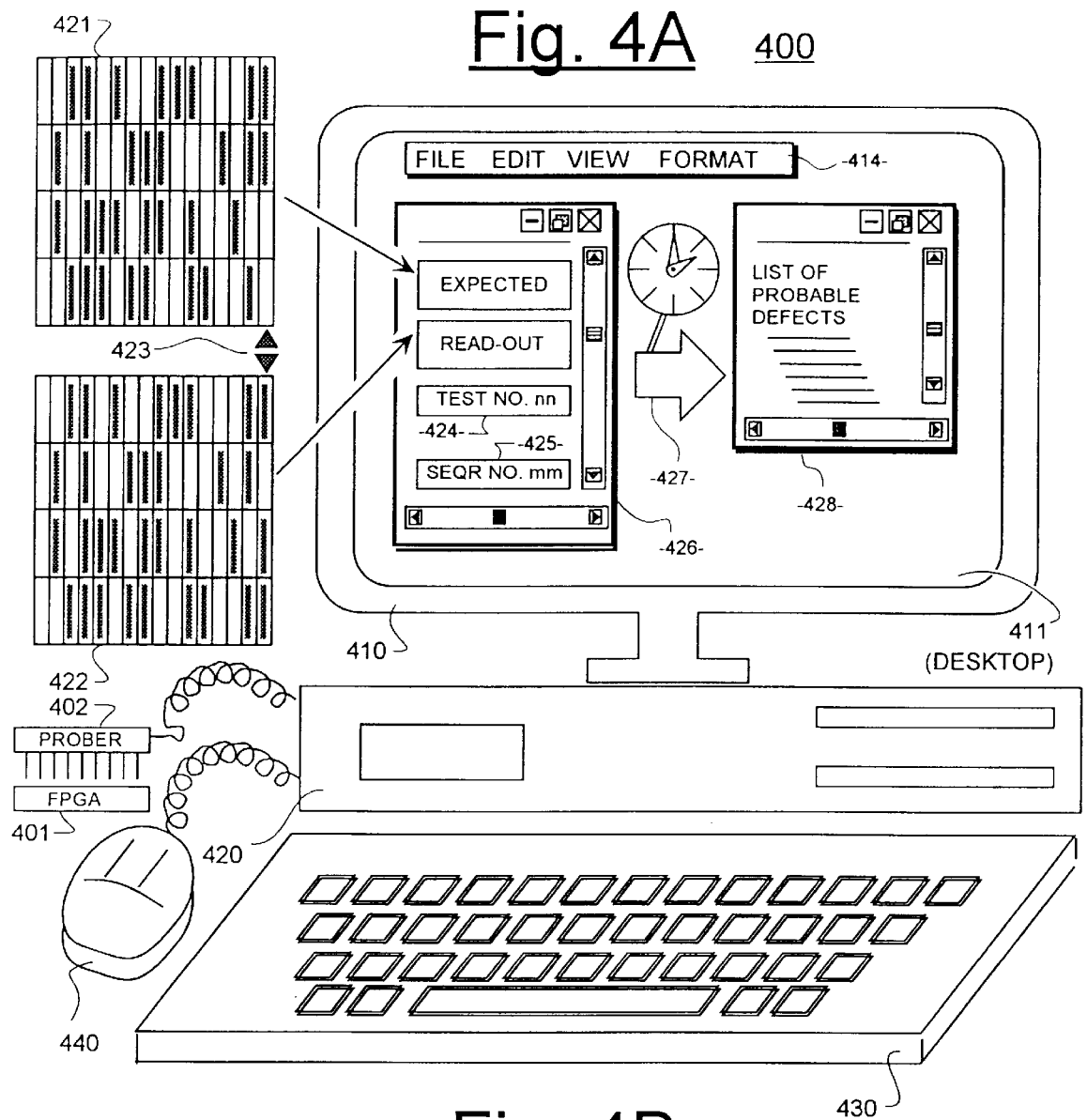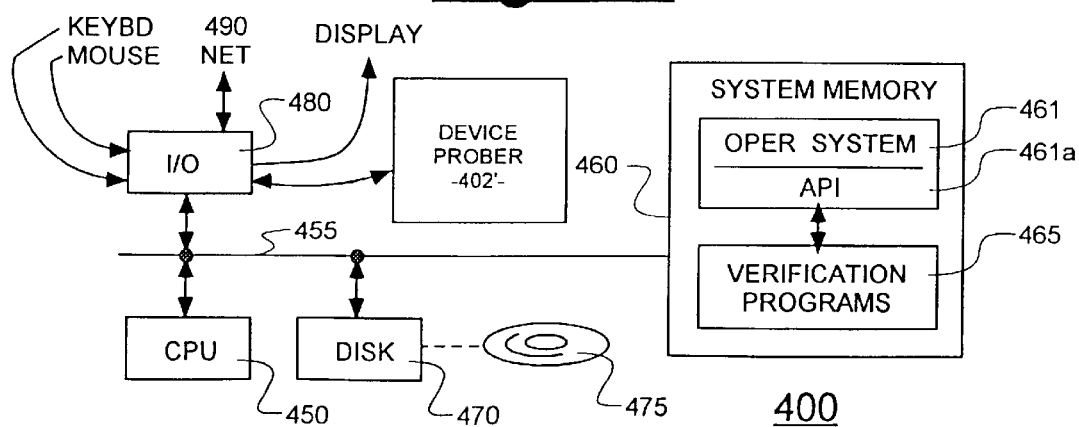

SCALABLE AND PARALLEL PROCESSING METHODS AND STRUCTURES FOR TESTING CONFIGURABLE INTERCONNECT NETWORK IN FPGA DEVICE

This is a division of application Ser. No. 09/692,694, filed Oct. 18, 2000, now U.S. Pat. No. 6,470,485.

CROSS REFERENCE TO RELATED APPLICATIONS

The following co-pending U.S. patent application is owned by the owner of the present application and its disclosure is incorporated herein by reference:

(A) Ser. No. 09/187,689 filed Nov. 5, 1998 by Om P. Agrawal et al. and originally entitled, "TILEABLE AND COMPACT LAYOUT FOR SUPER VARIABLE GRAIN BLOCKS WITHIN FPGA DEVICE" (which application has subsequently issued as U.S. Pat. No. 6,154,051, issued Nov. 28, 2000).

CROSS REFERENCE TO RELATED PATENTS

The following U.S. patents are related to the present application and their disclosures are incorporated herein by reference:

(A) U.S. Pat. No. 6,127,843, issued Oct. 3, 2000 to Om P. Agrawal et al. (filed as Ser. No. 08/996,049 on Dec. 22, 1997) and entitled, DUAL PORT SRAM MEMORY FOR RUN-TIME USE IN FPGA INTEGRATED CIRCUITS;

(B) U.S. Pat. No. 6,097,212 issued Aug. 1, 2000 to Om Agrawal et al, (filed as Ser. No. 08/948,306 on Oct. 9, 1997) and entitled, VARIABLE GRAIN ARCHITECTURE FOR FPGA INTEGRATED CIRCUITS;

(C) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(D) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (E) U.S. Pat. No. 5,185,706 issued Feb. 9, 1993 to Om Agrawal et al.

BACKGROUND

1. Field of Invention

The invention relates generally to integrated circuits having repeated configurable logic and configurable interconnect structures provided therein. The invention relates more specifically to the problem of thoroughly and quickly testing large numbers and different types of interconnect resources such as those provided within an integrated circuit monolith that contains a programmable logic circuit such as a field programmable gate array (FPGA).

2. Description of Related Art

As the density of programmably-reconfigurable, digital logic circuitry within integrated circuits (IC's) increases, and as the signal-processing speed of such logic also increases, the ability of all parts of the interconnect within the IC to correctly and consistently route all signals in timely and accurate fashion between spaced-apart logic sections (e.g., CLB's or Configurable Logic Blocks) becomes more and more important to proper operation of the integrated circuit.

Individual ones of mass-produced, in-field re-programmable IC's may have a number of localized defects within their interconnect resources such as: regional or spot short-circuits; broken-open lines; lines stuck-at a particular logic level; stuck-open signal routers; and stuck-closed signal routers. Any one or more of these and yet other circuit defects can interfere with proper device operation. Accordingly it is desirable to be able to test the interconnect resources of such mass-produced IC's thoroughly, or as near thoroughly as practical, in order to provide a commensurate level of confidence (e.g., close to 100% test coverage) regarding the in-field operability of the interconnect. It is further desirable to be able to test the interconnect resources of such mass-produced IC's in a time efficient manner and to minimize the use of expensive test equipment thereby allowing for economical verification of the hypothesis that all or a substantial portion of the IC's resources are functioning as intended.

Testing of interconnect resources (hereafter, interconnect verification testing or 'IVT') at high speed and with thorough; or close-to-thorough coverage, is particularly difficult to achieve in cases where the interconnect is programmably re-configurable and the IVT is being conducted after the IC chips have been packaged in their respectively insulating, and pin-out limited carriers (e.g., ceramic IC packages). One reason for the difficulty is that each part of the configurable interconnect can have a large number of connection permutations, all of which may need to be tested during IVT in order to provide confidence that the configurable interconnect is fully operational. Another reason for the difficulty is that direct access to all internal nodes of the IC is usually no longer available after the IC has been encased in its package. Testers are limited to electrically coupling to the chip's interior by way of the limited number of external pins or terminals that are provided by the package's pinout.

Even before the above-described post-packaging phase, in a so-called, wafer-sort testing phase which occurs prior to packaging, the number of on-die, exposed nodes available to the testing equipment is limited by a number of factors including the number and types of probe fingers on the test equipment and the number of probe-able nodes (e.g., pads) provided on each IC die. While these constraints on testability are applicable to most IC's, they are particularly a problem for FPGA's.

More specifically, when it comes to re-programmable logic arrays such as Field Programmable Gate Arrays (FPGA's), practitioners in the art of mass-production testing have begun to recognize that very large numbers of conductors of differing lengths, of differing orientations, and of other differing attributes may have to be each individually and methodically tested even as such conductors are connected to respective, but operationally-questionable, programmable signal routers (e.g., PIP's—Programmable Interconnect Points) of various kinds. Practitioners want to be able to economically test each interconnect line for its ability to cleanly transmit a logic "1" level or pulse without interference from surrounding lines or routers, and counterposingly, to be able to economically and further test each interconnect line for its ability to cleanly transmit a logic "0" level or pulse, again without interference from surrounding lines or routers. This can be a massive undertaking in densely wired circuitry such as modern FPGA's because their signal-routing switchboxes (e.g., PIP matrices) tend to be heavily populated and this leads to exponentially increasing numbers of possible interconnect permutations.

One approach that has been proposed for tackling this massive problem is called AND/OR tree testing. It is described in a research paper by W. K. Huang, F. J. Meyer, and F. Lombardi, entitled "An Approach for Detecting Multiple Faults in FPGAs", Dept. of Computer Science, Texas A&M University). Briefly, when AND/OR tree testing is carried out, selected ones of the programmable logic circuits of the FPGA are configured to each implement a four-input, receipt-verifying and result-forwarding circuit consisting of: (1) an AND gate, (2) an OR gate, and (3) a 2-to-1 dynamic multiplexer.

More specifically, under AND/OR tree testing, the progression of a respective logic "1" pulse can be timed and verified as it snakes its way from a first I/O pin, and through a logic-blocks implemented series of AND gates to a second I/O pin. If the logic "1" pulse (a 0-to-1-to-0 transition) is detected at the second I/O pin, that information can be used to verify that interconnect resources within the series chain of AND gates can propagate such a logic "1" pulse. Similarly, the progression of a respective logic "0" pulse can be timed and verified as it snakes its way from the same first I/O pin, and through a logic-blocks implemented series of OR gates to the second I/O pin. If the "0" pulse is seen to be faithfully reproduced a short time later at the second I/O pin, that information can be used to verify that interconnect resources within the series chain of OR gates can propagate such a "0" pulse.

The reason why the four-input, receipt-verifying and result-forwarding circuit is used in the AND/OR tree testing of W. K. Huang et. al is to avoid having to re-program the under-test FPGA in between the "1" pulse propagating test and the "0" pulse propagating test. Each re-programming of a given FPGA can consume as much as 500 mS (milliseconds) or more. It is the re-programming rather than the testing itself which tends to consume the bulk of overall test time. With Huang's dynamically-switchable, receipt-verifying and result-forwarding circuit, one or the other of a combinatorial logic series of AND gates or OR gates may be established for timing and verifying respective propagation of a "1" pulse and a "0" pulse.

A main drawback of the AND/OR tree method is that a very large number of different FPGA configuration patterns may still have to be programmed into a same IC in order to verify that all, or a fair majority of its interconnect resources are working properly. As already explained, each re-programming of a new configuration pattern into the FPGA can consume as much as 500 mS (milliseconds) or more. If the number of different patterns needed for high-confidence verification is on the order of 500 or more, then a single, under-test IC may consume as much as 250 seconds (over 4 minutes) of testing time or more, simply for the pattern programming time. This magnitude of per-chip testing time is not acceptable. Note that we are not even counting the amount of additional time it may take to actually perform the interconnect verification tests, or other logic function tests. The pattern re-programming time is by itself a major problem.

For one specific family of high-density FPGA's (60,000 gate devices), the present inventors calculated that approximately 800 pattern re-programmings would be required for each chip in order to thoroughly test just a partial subset of its interconnect resources under the AND/OR tree method. This is not acceptable. A radically different solution is needed.

SUMMARY OF INVENTION

In accordance with the invention, a plurality of feedback-wise self-sustaining and parallel-wise executing sequential state machines are programmably established in an under-test FPGA device and each is seeded with a respective starting state. The plural sequencers are preferably programmed to step through a plural number of unique, excitation states where that maximal number is dependent on the state-storing and state-recognizing capabilities of the programmable logic units that are used to implement the sequencers. The feedback of each sequencer is provided through a respective and under-test part of the FPGA's interconnect structure. If the corresponding set of feedback-supporting, interconnect resources are operating correctly for each given sequencer, that sequencer should independently step from its starting state, and through a feedback-sustained sequence of plural, unique and interconnect-challenging, excitation states until reaching a predefined pause step. The latter pause step is also defined herein as an interconnect-verifying, readout state. There can be more than one interconnect-verifying, readout state in a full testing cycle, but the number of pause states should be smaller than the total number of unique, interconnect-challenging states.

At each interconnect-verifying, readout state, a serial readout may be conducted of a shadowing version of the state-holding registers. (The state-holding registers preferably retain their states during this readout.) If indeed, the corresponding set of feedback-supporting, interconnect resources of each sequencer was operating correctly, then the serially-read out state for that sequencer should be what was expected. On the other hand, if the corresponding set of feedback-supporting, interconnect resources of a given sequencer is defective; because of a short circuit and/or an open circuit and/or a stuck signal router; then the readout state for that sequencer will probably be other than what was expected.

It is possible however, that in a given peculiar set of circumstances, the readout state of a sequencer with defect-containing interconnect nonetheless turns out to be the same as the readout that was expected for that pause phase. The likelihood of the expected matching the actual readout again and again in subsequent pause-and-verify states is relatively small. As such, detection of expected readout states at multiple pause points should provide a high degree of confidence that the challenged interconnect resources within the sequencer are being fully exercised and demonstrated to be operating properly.

A first advantage of carrying out interconnect verification testing in accordance with the sequencer-based aspect of the invention is that such can be easily scaled to handle larger and larger sized FPGA's. As the number of logic blocks in an FPGA family grows, one can simply implement more sequencers for parallel processing the interconnect-challenging test vectors. Test time may be kept roughly the same even though the number of logic blocks increases. (Serial readout time may increase, though.) Also, if the feedback loop in each sequencer is kept relatively short and fast, then scaling to larger-sized FPGA's should not add significantly to overall test time because signal propagation delay through the series of challenged wires in each feedback loop remains roughly constant. This is to be contrasted with other approaches that use very long serial chains and therefore suffer from increasing delays as the size of the FPGA is scaled upwardly.

A second advantage of carrying out interconnect verification testing in accordance with the sequencer-based aspect of the invention is that such testing does not need to use a large number of pins at the package-to-exterior interface. Even a small pinout for just supporting JTAG or like boundary scan can be used. The test vectors may loop internally and in parallel. They do not have to be output in parallel from the device's pinout. As a result, testing facilities do not need to keep on hand a large variety of different test programs, where each such program is custom tailored to a different kind of package type and/or a different member of an FPGA family. Also, specialized testing equipment with relatively high densities of probe fingers may not be needed because a rudimentary ability to interface with the chip's boundary scan circuitry should be enough. Even test platforms with small numbers of probes may be used providing the test equipment has enough interface pins or probes to interface with the JTAG port of the under-test package or die. Thus, a wide variety of different kinds of test platforms may be used for carrying out interconnect verification testing in accordance with the sequencer-based and boundary scan aspects of the invention.

A third advantage of carrying out interconnect verification testing in accordance with the sequencer-based aspect of the invention is that the number of pattern reconfigurations made to the under-test FPGA can be greatly reduced. Thus the total time for pattern reconfigurations can be reduced. This can happen because each sequencer can be programmed to apply a large number of unique, interconnect-challenging test vectors for each pattern reconfiguration. Hence more tests may be performed per reconfiguration. Additionally, when a preferred, circuitous routing is used for each given feedback signal, where that circuitous routing sequences its interconnect-challenging signals through a large number of non-overlapping interconnect conductors and a correspondingly large number of routing switches, more of the interconnect resources can be simultaneously tested during each of the plural steps taken by each sequencer. This helps to reduce the number of pattern reconfigurations needed for thorough, or near-thorough interconnect verification testing.

Other aspects of the invention will become apparent from the below detailed description.

BRIEF DESCRIPTION OF THE DRAWINGS

The below detailed description makes reference to the accompanying drawings, in which:

FIG. 2A illustrates a first embodiment wherein an additional or alternate use of 4-LUT's is made within an FPGA for implementing interconnect-challenging sequencers in accordance with the invention;

FIG. 4A illustrates a computerized testing system that may be programmed and operated in accordance with the invention; and FIG. 4B schematically illustrates a possible internal configuration for the computerized testing system of FIG. 4A.

DETAILED DESCRIPTION

Figure 1A:
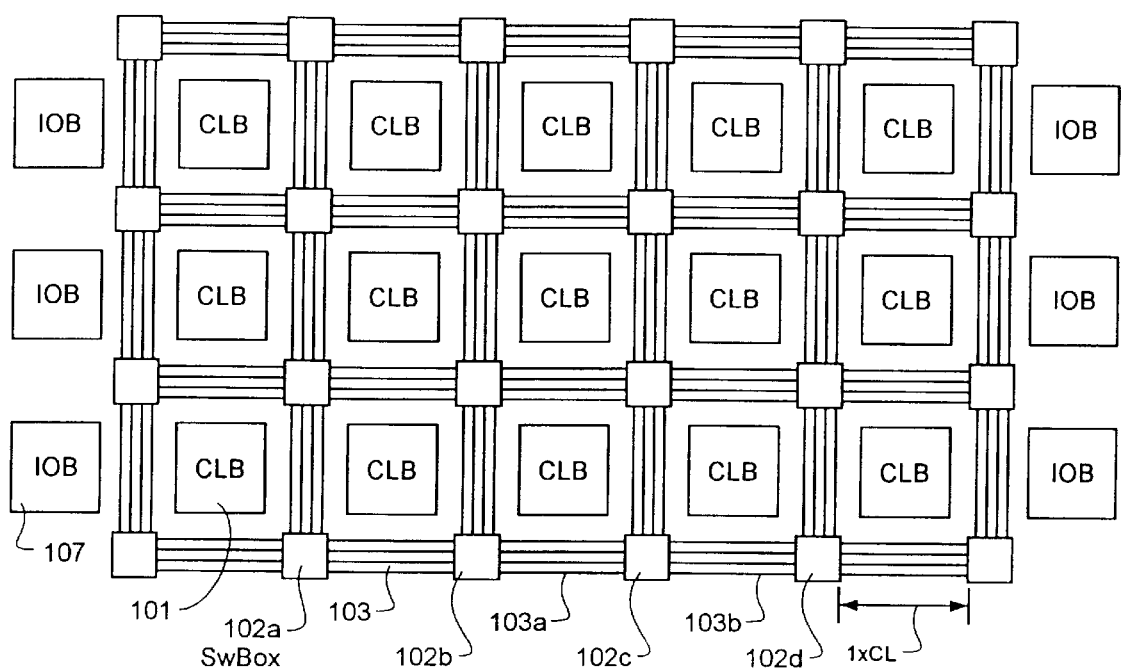
FIG. 1A illustrates in a general way, an array of Configurable Logic Blocks (CLB's) with a general-purpose interconnect network and IOB's for interfacing to external circuitry.

FIG. 1A shows a first integrated circuit device 100 having a conventional FPGA layout. The figure is provided merely for introducing the problems associated with the testing of the configurable interconnect structures of programmable logic devices (PLD's) in general, and more particularly with testing those of field programmable gate arrays (FPGA's). As seen, a regular pattern of Configurable Logic Blocks (CLB's) is distributed in spaces between intersecting vertical and horizontal interconnect channels. A series of Input/Output Blocks (IOB's) is distributed about the periphery as shown.

Furthermore in FIG. 1A, one of the CLB's is denoted as 101. One of a repeated plurality of channel-interconnecting switchboxes is denoted as 102a (SwBox). A plurality of horizontal lines that each extends continuously between but not beyond switch box 102a and the next switch box (102b) is denoted as 103. Each line within bus 103 may be referred to as a single-length, general interconnect line (a 1×CL line). One of the IOB's is denoted as 107.

Each of the vertical and horizontal interconnect channels is defined by a respective, linear sequence of switch boxes such as 102a, 102b, and interposed interconnect lines such as those of bus 103. For the arrangement 100 of FIG. 1A, the notation, 1×CL indicates that the corresponding line length is about one times a side dimension of the corresponding CLB (one CLB length).

When signals are expected to travel from one CLB to another CLB in the illustrated device 100, the signals must successfully travel without interference across at least two interconnect lines (e.g., 103a, 103b) and through at least one interposed switchbox (e.g., 102c). Switchboxes such as 102b and 102c which are disposed at terminal ends of the CLB-to-CLB interconnecting lines, 103a and 103b, may interfere with the signal transmission if PIP's in the terminal switchboxes are stuck closed or otherwise malfunctioning. And of course, if one or more of the interposed switchboxes (102c) between the communicating CLB's are malfunctioning, or one or more of the interconnect lines 103 are broken, that too can interfere with the desired signal transmission. It is desirable to provide efficient means for testing the full operabilities of the switchboxes, of the interconnect lines, and of other interconnect resources as may be provided within a given FPGA. That is not as simple as may sound. The configurable nature of the interconnect resources and the sheer numbers in which such resources are provided within modern devices raises the possibility that testers may have to perform astronomically large numbers of tests in order to fully test the interconnect under certain test methodologies.

Figure 1B:
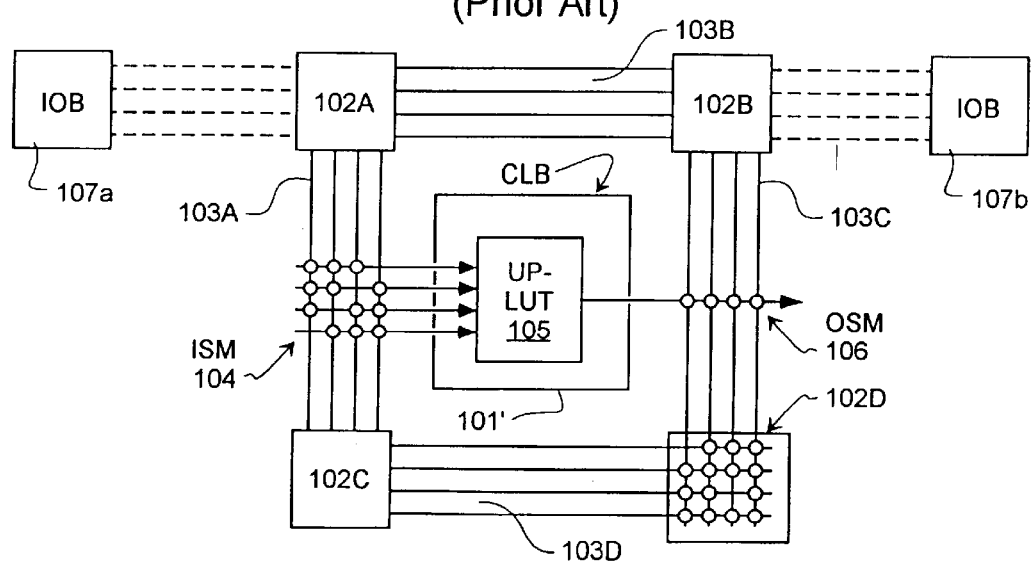
FIG. 1B shows in a general way, how coupling may be provided between adjacent interconnect lines of the general-purpose interconnect network and a user-programmable lookup table (UP-LUT) within an exemplary CLB.

FIG. 1B shows some further details for a conventional design of an FPGA device such as that of FIG. 1A. Once again, the purpose here is merely to introduce an assortment of problems that may be associated with full testing of the configurable interconnect structures of FPGA's. Each CLB (e.g., 101') may be characterized as having at least one, user-programmable, lookup table (UP-LUT) 105 that can receive a given number of independent input term signals from adjacent interconnect lines and can output a LUT result signal onto one of its AIL's (adjacent interconnect lines). The result signal can be any user-defined, Boolean function of the LUT's independent input term signals.

In the example of FIG. 1B, there is provided with each CLB, a corresponding inputs-acquiring matrix 104 for acquiring the independent input term signals for the CLB's LUT 105. The illustrated ISM (Input Switch Matrix) 104 is partially-populated and is therefore comprised of less than 16 Programmable Interconnect Points (PIP's) distributed over the corresponding 4×4 array of lines-intersection points formed by the 4-line vertical bus 103A crossing with the 4 horizontal input terminals of LUT 105. The illustrated ISM 104 is organized to allow its UP-LUT 105 to obtain each of its respective 4 input term signals from a respective 3 of the 4 lines in the left vertical bus 103A. A full-width output switching multiplexer (OSM) 106 is provided in this example at the output side of the CLB for allowing its UP-LUT 105 to route its 1-bit result signal to any one of the 4 lines in the right vertical bus 103C.

Each of the exemplary switchboxes 102A–102D in FIG. 1B contains a partially-populated matrix of PIP's such as represented within box 102D. This switchbox-internal routing-matrix allows a signal on any first line of the switchbox to find at least 3 possible ways of continuing to travel along any crossing other line of the switchbox. The illustrated array of PIP's in 102D is merely for serving as an example. Those skilled in the art will appreciate that a wide variety of partially-populated and/or fully-populated matrices may be used and combined for respectively varying purposes such as providing more or less routing flexibility, reducing capacitive loading, and/or reducing signal propagation delay time for signals traveling through the general interconnect structure.

In modern FPGA's, the interconnect structure is not as simple as shown by introductory FIGS. 1A and 1B. Many different kinds of conductors, switchboxes, signal boosters, and the like may be provided to try to overcome the above-mentioned problems with signal-propagation delays. For example, practitioners may choose to reduce the delays encountered by signals traveling between nearby CLB's, by using so-called, direct-connect wires. Such direct-connect wires provide dedicated paths between a signal-sourcing CLB and adjacent CLB's in its neighborhood. (Direct connects are not shown in FIGS. 1A–1B). Practitioners may further choose to reduce the delays encountered by signals traveling between far apart CLB's, by using so-called, longline wires. Such longlines often each extend continuously in the vertical or horizontal direction across the full span of the array of CLB's. (Longlines are also not shown in FIGS. 1A–1B).

Direct-connects, longlines, and other such alternate interconnect schemes do not provide cure-all solutions. General, programmable interconnect is often still needed. One cannot provide a separate direct-connect wire between each first CLB that may act as a signal-source and every other CLB that may potentially need to receive the signal because the number of wires would explode to astronomic values as array size scales upwardly. Similarly, one cannot depend solely on linear longlines for interconnect because routability would be severely limited and excessive delay and resource wastage may be imposed by signals that need to travel only a short distance. It is therefore common to provide a mix of different lengths and kinds of interconnect lines, including general interconnect kinds that provide generically flexible signal routing and specialized ones such as direct-connect lines and longlines.

A question that often arises after a particular mix of specialized and general-purpose interconnect resources are designed is: how to efficiently test such mixed interconnect resources in a mass production setting?

Referring still to FIG. 1B, a brute force approach might try to transmit an externally-sourced, excitation pulse from a pad/pin serviced by IOB 107a for external detection at another pad/pin serviced by IOB 107b, where the signal transmission path sequentially snakes through switchbox 102A, interconnect bus 103A, ISM 104, LUT 105, OSM 106, interconnect bus 103C, switchbox 102B, and finally out of IOB 107b for external verification. However, this brute force approach would end up testing only a very small fraction of the interconnect resources available within the illustrated circuit. For example, only one respective PIP in each of ISM 104 and OSM 106 would be exercised with the one pulse transmission. Thereafter the FPGA would have to be re-programmed to test yet another combination of PIP's. The number of possible PIP combinations can grow to be a very large number. The time consumed for pattern re-programming will then be a major problem.

Figure 1C:
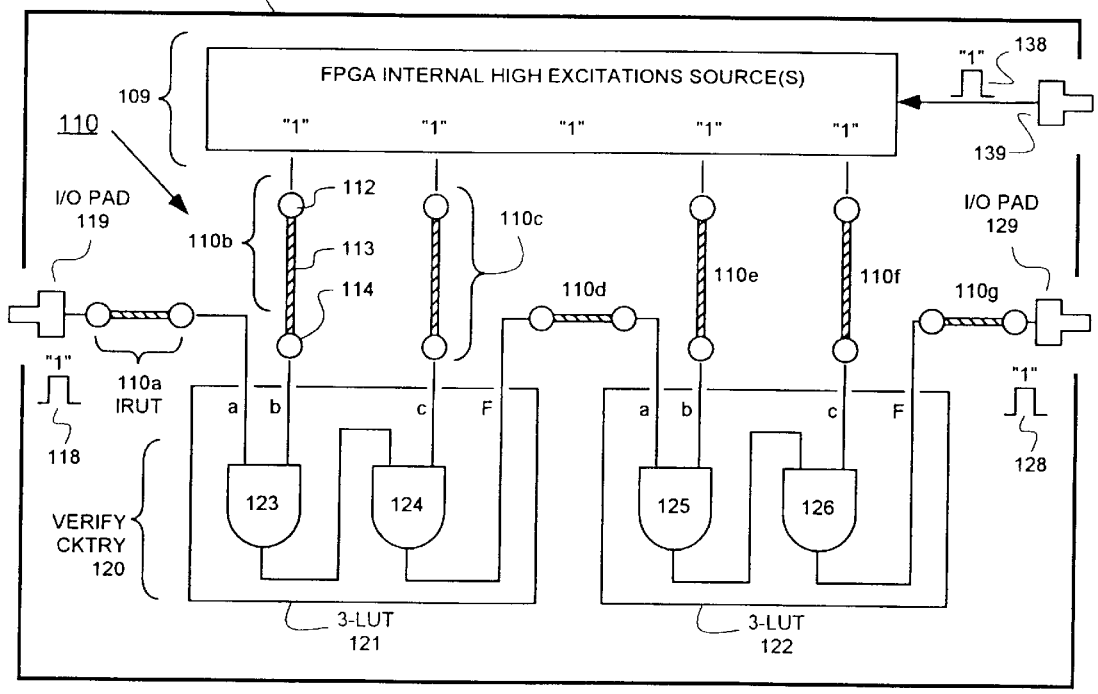
FIG. 1C shows respective AND-tree and OR-tree circuits that may be implemented in different re-programming of individual 3-input LUT's (3-LUT's) for verifying propagation of respective "1" and "0" pulses through the under-test interconnect resources.
Figure 1C:
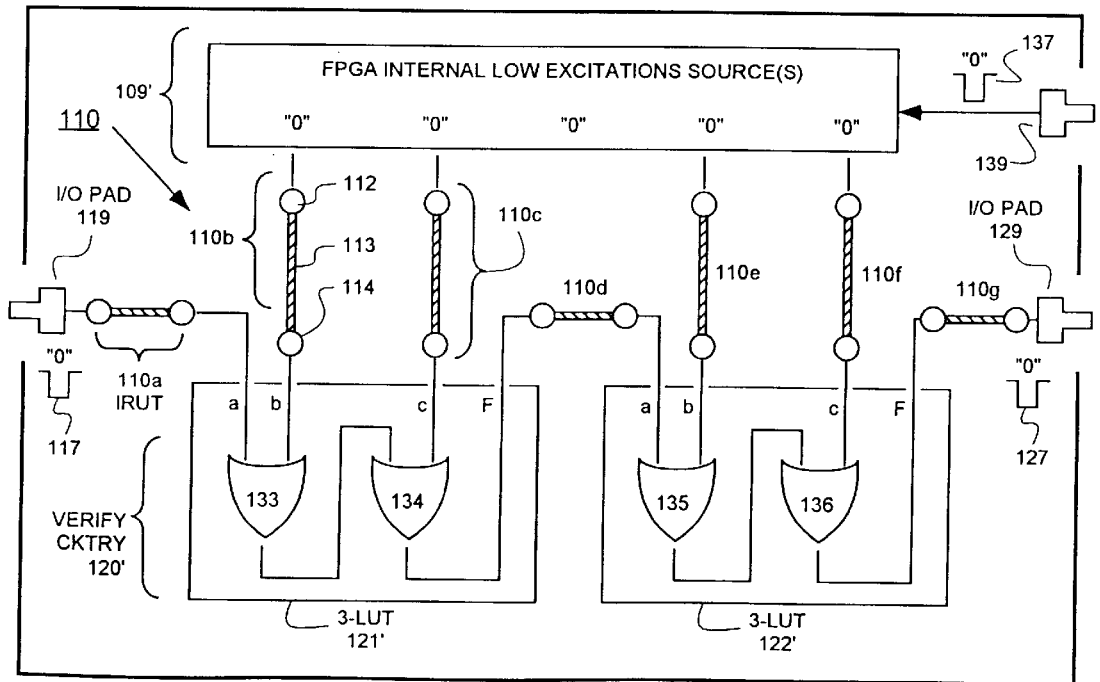

FIG. 1C schematically illustrates both of the so-called AND tree testing technique 100C, and the OR tree testing technique 100D, mentioned above. These tests 100C–100D can simultaneously exercise many PIP's and interconnect conductors with a one pulse transmission. It is assumed that the repeated programmable logic circuits (CLB's) of a given FPGA 110 each includes at least one, 3-input lookup table (a 3-LUT) that can be programmably configured to implement any truth table function of at least 3 independent input term signals. A large group or band 120 of the 3-LUT's such as 121 and 122, are each configured to internally implement a three-input, excitation-verifying circuit. An adjoining group or band 110 of interconnect resources such as PIP's 112 and conductors 113 are designated as the interconnect resources under-test (IRUT's). Yet another adjoining section 109 of the under-test FPGA supplies excitation signals to the interconnect resources under-test (IRUT's) 110. The excitation-verifying circuit 120 is used to verify that the sourced, excitation signals successfully pass through the under-test, interconnect resources (IRUT's 110). The designation of which band of interconnect resources are 'under-test', which band of 3-LUT's (CLB's) defines the excitation-verifying circuit 120, and which band of CLB's and/or further interconnect resources defines the excitation-supplying sources (109, 119, 139) can be iteratively stepped down across the FPGA during successive re-programmings of the FPGA. In essence, a 'marching bands' effect is produced over the course of programming the FPGA, testing the IRUT band 110, and then re-programming the FPGA to test a next successive IRUT band.

In the first FPGA configuration shown at 100C, the three-input, excitation-verifying circuit 120 of each 3-LUT such as 121 consists of a first AND gate 123 having as its inputs, LUT input terminals 'a' and 'b'; and a second AND gate 124 having as its inputs, LUT input terminal 'c' and the output of AND gate 123. The output of the second AND gate 124 is defined at the LUT's function output terminal, F. Similarly in the second LUT 122, a series tree of AND gates 125 and 126 is formed. The F output of LUT 121 connects to the 'a' input of LUT 122 by way of a to-be-tested interconnect resource such as 110d. Although only two LUT's, 121 and 122, are shown in configuration 100C, those skilled in the art will understand that the series chain of AND gates can be made much longer by cascading further such LUT's together in the manner shown so that an entire row of CLB's can function as an excitation-verifying circuit 120 for a corresponding entire row of under-test, interconnect resources (IRUT's 110).

One part (e.g., a first end) of each respective, to-be-tested conductor, such as conductor 113 for example, is programmably coupled to a verification-receiving, input terminal (e.g., 'b') of a respective 3-LUT (e.g., 121) by way of a respective signal-acquiring PIP such as PIP 114. PIP 114 could reside for example in ISM 104 of FIG. 1B. A second part (e.g., a second end) of the to-be-tested conductor 113 is either programmably coupled (by PIP 112), or fixedly coupled, to a verification-signal injecting source such as FPGA section 109 or I/O pad 119. PIP 112 could reside for example in switchbox 102A of FIG. 1B. Alternatively or additionally, conductor 113 may be a direct-connect line that is directly driven from a dedicated output of another CLB—not shown—which other CLB is situated in excitation sourcing region 109 of the FPGA. (Although not shown, it is understood that each I/O pad or pin such as 119 typically has a respective IOB interposed between the pad/pin and the corresponding under-test, interconnect resource; e.g., IRUT 110a.)

If the injected excitation-signal is a logic '1' pulse such as shown at 118, then in order for a corresponding logic '1' pulse such as shown at 128, to emerge at a verification point such as probe-able I/O pad 129, every one of IRUT's 110a, 110b, . . . , 110g will have to be operating such that a respective plurality of logic highs ("1") appear at all the input terminals of the cascaded AND gates 123–126. Note that the synchronization (timing and pulse width) between the injected '1' pulses such as 118 and 138, at respective I/O pads 119 and 139 may be modulated to verify that the observed verification pulse 128, at respective I/O pad 129, is indeed the result of every one of IRUT's 110a, 110b, . . . , 110g operating as expected. Those skilled in the art will understand the various ramifications of the test procedures enabled by configuration 110C, and as such we need not delve deeper into them here.

In the second FPGA configuration shown at 100D, the three-input, excitation-verifying circuit 120' of each 3-LUT, such as LUT 121' has been re-programmed to consist of a first OR gate 133 having as its inputs, LUT input terminals 'a' and 'b'; and a second OR gate 134 having as its inputs, LUT input terminal 'c' and the output of OR gate 133. The output of the second OR gate 144 is defined at the LUT's function output terminal, F. Similarly in LUT 122', a series tree of OR gates 135 and 136 is formed. The F output of LUT 121' connects to the 'a' input of LUT 122' by way of a to-be-tested interconnect resource such as 110d. Although only two OR-implementing LUT's, 121' and 122, are shown in configuration 100D, those skilled in the art will understand that the series chain of OR gates can be made much longer by cascading further such LUT's together in the manner shown.

If the injected excitation-signal is a logic '0' pulse such as shown at 117, then in order for a corresponding logic '0' pulse such as shown at 127, to emerge at a verification point such as non-buried I/O pad 129, every one of IRUT's 110a, 110b, . . . , 110g will have to be operating such that a respective plurality of logic lows ("0") appear at all the input terminals of the cascaded OR gates 133–136. Note that the synchronization (timing and pulse width) between the injected '0' pulses such as 117 and 137, at respective I/O pads 119 and 139 may be modulated to verify that the observed verification pulse 127, at respective I/O pad 129, is indeed the result of every one of IRUT's 110a, 110b, . . . , 110g operating as expected. Those skilled in the art will understand the various ramifications of the test procedures enabled by configuration 110D, and as such we need not delve deeper into them here.

Because the re-programming of test configurations consumes so much time, F. Lombardi (co-author of above cited paper, "An Approach for Detecting Multiple Faults in FPGAs") has proposed the use of 4-LUT's (4-input lookup tables) and the configuration shown in FIG. 1D for implementing excitation-verifying circuits. As seen within the 4-LUT designated as 150, the Lombardi-proposed, excitation-verifying circuit consists of: (a) first and second AND gates such as respectively shown at 143 and 145, (b) first and second OR gates such as respectively shown at 144 and 146, and (c) first and second 2-to-1 dynamic multiplexers such as respectively shown at 147 and 148. As in the configurations 100C and 100D of FIG. 1C, the proposed configuration 100E of FIG. 1D couples a first IRUT 110a' to the 'a' input of the illustrated 4-LUT 150. and the respective, 'b', 'c' and 'F' terminals of the proposed 4-LUT 150 respectively couple to IRUT's (interconnect resources under-test) 110b', 110c' and 110d'. What is different is that the additional 'd' input of the illustrated 4-LUT 150 functions as the select terminal for multiplexers 147, 148 and connects to an AND/OR select line 185 provided within the FPGA. The AND/OR select line 185 is preferably a maximum-length (MaxL) longline that extends continuously across one of the horizontal and vertical dimensions of the logic block array so that many, similarly configured 4-LUT's such as 150 and 160 can be simultaneously driven by line 185 into either an AND-tree implementing mode or an OR-tree implementing mode. The 'd' input may couple to MaxL line 185 by way of a PIP such as 182 and may be driven by I/O pin/pad 181.

The integrity of the MaxL line 185 may be independently tested. This may be seen from the structuring of yet another MaxL line 195 shown within a possible, excitation-supplying circuit 109a–109b. In the contemplated FPGA, separate IOB's 192 and 198 are couplable to opposed ends of the longline 195. Test pulses may be applied at I/O pad 191 and integrity-proving detections may be made at I/O pad 199. In the illustration, the output of multiplexer 109a is intended to be connected to the upper part of IRUT 110b' while the output of multiplexer 109b is intended to be connected to the upper part of IRUT 110c'. A test pulse supplied on either of pins 191 or 199 may be transmitted via PIP's such as 193 for skew-compensated distribution to all IRUT's such as 110b', 110c', 110e', 110e', etc.

Figure 1D:
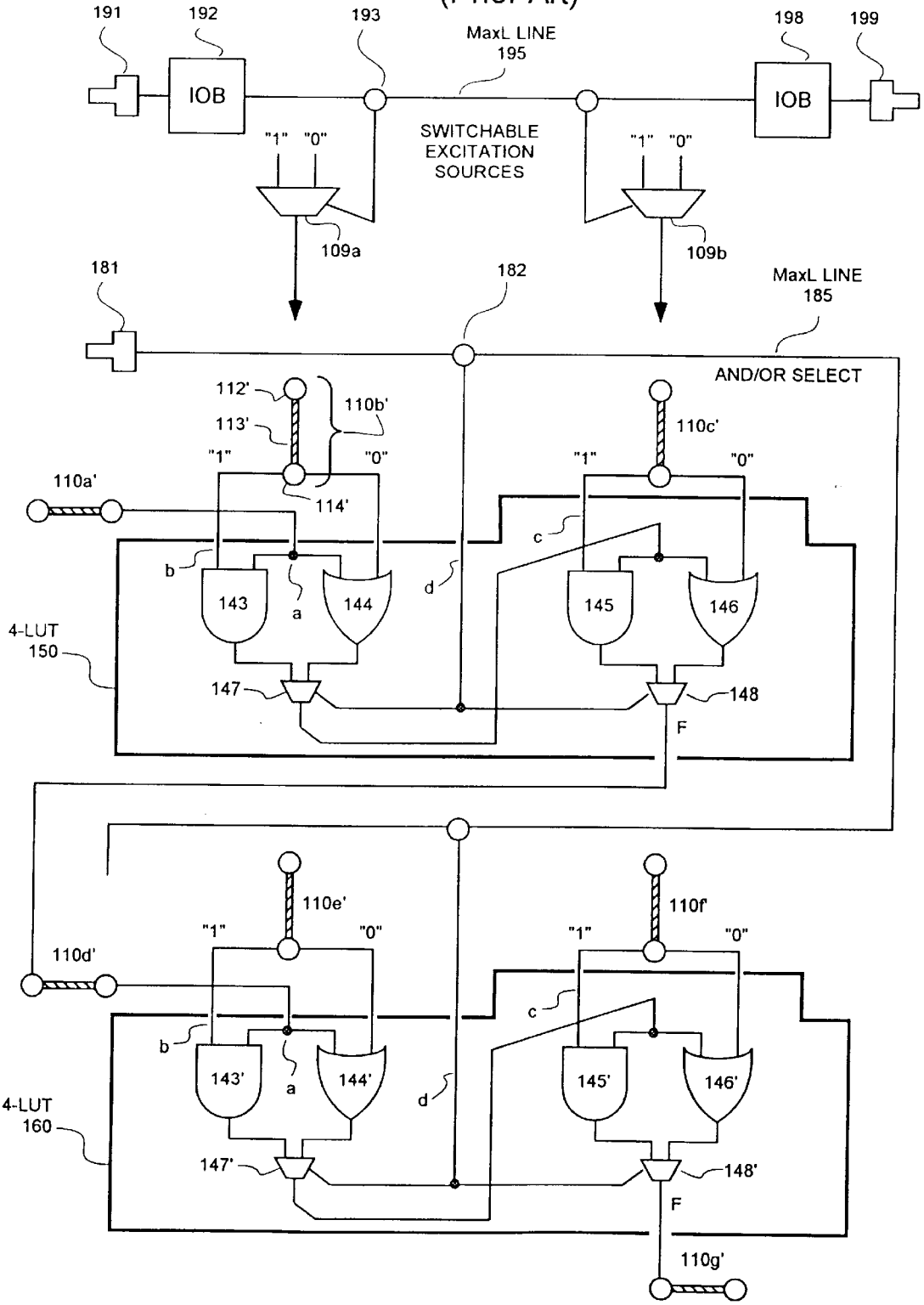
FIG. 1D shows an earlier-proposed use of 4-LUT's for simultaneously implementing with one programming of an FPGA both AND-tree and OR-tree circuits.

While the switchable-AND/OR trees of FIG. 1D provide a good improvement over the fixed configurations shown in FIG. 1C, they still suffer from numerous drawbacks. First, not every input terminal of every 4-LUT in configuration 100E is being used simultaneously for testing at least one configuration-selected conductor (e.g., 113') and its associated PIP's (e.g., 112', 114'). The 'd' input terminals of LUT's 150, 160 are being instead consumed for mode selection. Second, the switchable-AND/OR trees configuration of FIG. 1D still requires the 'marching bands' approach of FIG. 1C. It does not provide for uniform and/or simultaneous testing of IRUT's in all regions of the under-test FPGA. Third, the interconnect-challenging signals are either all ones (1's) or all zeroes (0's) in the respective AND-tree and OR-tree modes. The IRUT band is not challenged by a simultaneous mixture of 1's and 0's. Thus, certain kinds of crosstalk related defects and the like may escape detection.

FIG. 2A schematically illustrates a first embodiment 200 of an interconnect testing structure in accordance with the invention. Like the configurations described in FIGS. 1C and 1D, the testing structure 200 of FIG. 2A is implemented within the integrated circuitry of an FPGA device. Unlike the structures of FIGS. 1C and 1D, the lookup tables of this embodiment 200 are configured to implement sequential state decoders instead of AND/OR trees. It is assumed for the illustrated embodiment 200 that each configurable logic block includes at least one 4-input lookup table 250 and a corresponding, at least one, result-storing latch or register 255. There are a total of four state-bit storing registers, 255, 265, 275 and 285 provided for implementing a 16-state sequencer. Each of LUT's 250, 260, 270 and 280 generates a respective, next-state output bit: Ao, Bo, Co, Do of the overall sequencer circuit. If the under-test interconnect resources 210a–210b is operating as expected, then the respective 'a' through 'd' input terminals of each respective LUT 250–280 should receive a respective one of current-state bits QA, QB, QC, and QD. Because of this, each state-decoding LUT receives full information about what the current state of the overall sequencer is, as expressed by the QA–QD outputs of respective registers 255–285. Given this full information about the current state, each decoder LUT 250–280 can thereby fully determine what next-state bit Ao–Do it is supposed to respectively output.

When the illustrated, sequencer-implementing structure 200 is clocked by a corresponding clock signal (G-CLK) that is provided on global clock line 205, then, if all the interconnect resources under-test are operating as expected, the sequencer should responsively be able to step through a unique sequence of sixteen unique states and thereby verify the operability of the under-test interconnect resources (IRUT's) 210a–210p. If, however, one or more of the under-test interconnect resources (IRUT's) is defective, then it can be made highly likely that the sequencer will not correctly sequence through its expected series of successive machine states and that a given Nth state of the sequencer will be other than what is expected at the corresponding Nth clock pulse. The Nth state of the sequencer may be observed at a readout pin or pad such as pin/pad 229 of the under-test FPGA. A serial readout method for performing such detection will be detailed below.

First, however, let us explore the different successive sequences of states that may be generated by the illustrated sequencer 200. For purposes of description, we designate the 'a' input terminal of LUT 250 as a most significant bit (MSB) and we also designate this terminal as Aa because it belongs to the 16-state sequential decoder A that is implemented by LUT 250. Similarly, we designate the 'd' input terminal of LUT 250 as the least significant bit (LSB) of the 4-bit binary coded number whose respective other bits appear at the 'b' and 'c' input terminals of all the illustrated LUTs 250–280.

Figure 2B:
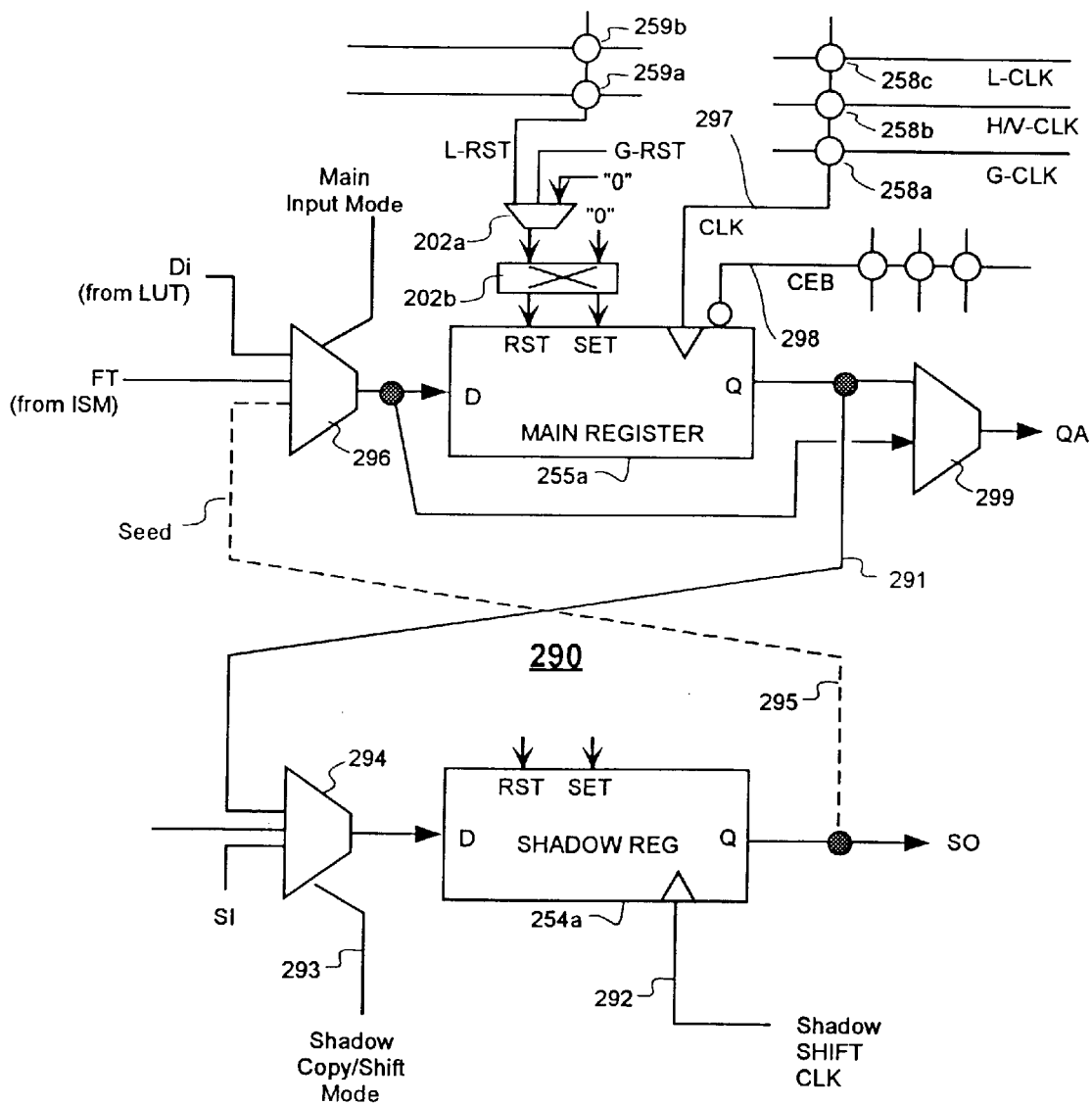
FIG. 2B illustrates a possible further detail for implementing shadow-based readout of the current states of the sequencers.
Figure 2C:
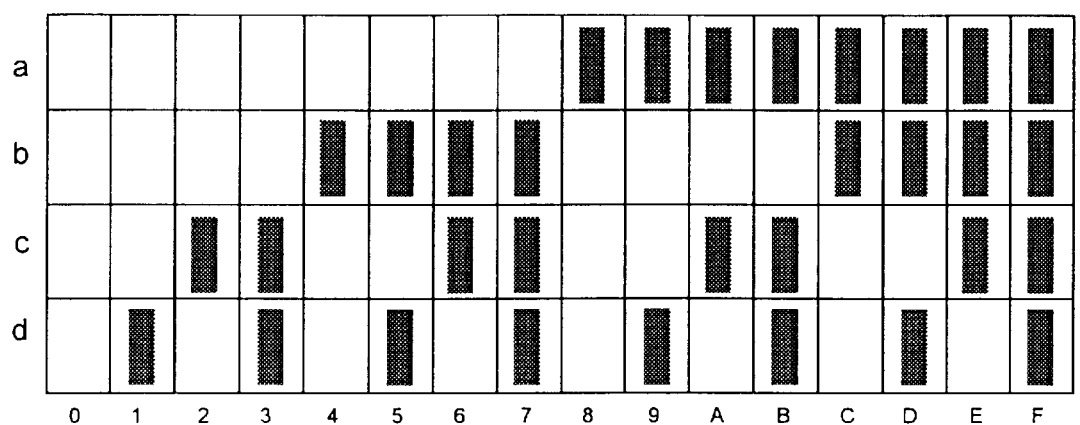
FIGS. 2C–2E show different kinds of ordered sequences that may be stepped through by interconnect-challenging sequencers in accordance with the invention.

Referring to FIG. 2C, and using hexadecimal notation, it should be noted that an interconnect-challenging, linear sequence of a routine and ordered form such as: 0, 1, 2, 3, 4, . . . , D, E, F will not aggressively exercise all of the IRUT's simultaneously for stuck-at-1 defects, stuck-at-0 defects, stuck-at-open PIP's, crosstalk problems, etc. This is so because in a routine numerical sequence (0, 1, 2, 3, . . . , F), the MSB (bit 'a') is toggling only at a lowest of the observable toggling frequencies. The LSB (bit 'd') is toggling only at a highest frequency. Accordingly in FIG. 2A, MSB IRUT's such as 210a, 210e, 210i and 210m are not being subjected to higher frequency stressing. LSB IRUT's such as 210d, 210h, 210L and 210p are not being subjected to lower frequency stressing. Also, each of the count bits in the routine count sequence is toggling independently of the state of more significant bits in the count. For example, the LSB or 'd' bit sequentially toggles on and off with each clock pulse irrespective of what the 'a', 'b' and 'c' bit values were in the previous state. Its toggling is not codependent on the toggling of the others of the verification points. If there is a defect in one of the IRUT's associated with a more significant bit of the count, that defect will not affect the next-state of the less significant bits. This lack of interdependence or codependence between the bits of the sequence state, ABCD, increases the possibility that a Nth state readout will match that which was expected even though there is a defect in the under-test part of the interconnect.

Figure 2D:
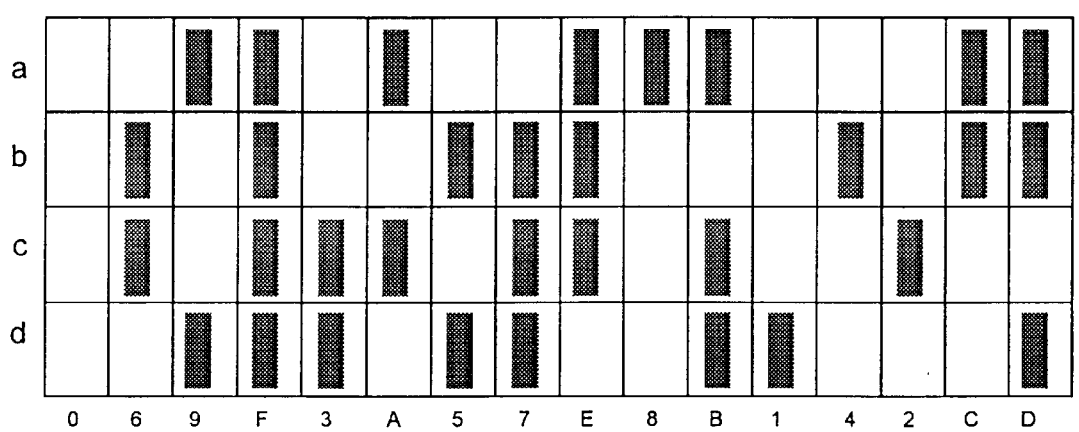

On the other hand, if a greater interdependence is provided for between the next-state logic level of each given bit and the current-state levels of all the other bits that represent the current-state (ABCD), then there will be a lesser likelihood that a Nth readout will happen to match that which was expected. By way of example, FIG. 2D illustrates the following, non-regular sequence: 0, 6, 9, F, 3, A, 5, 7, E, 8, B, 1, 4, 2, C, D. Note that each of the 'a', 'b', 'c' and 'd' bit stream appears to be a pseudo-random pattern whose next-state value often depends heavily on the current-state values of the others of the 'a'–'d' bits. Stated otherwise, each of the next-state values in each 'a', 'b', 'c' and 'd' bit streams is a function that is heavily dependent on the current states of the remaining others of the 'a'–'d' bits. By contrast, the consistently toggling 'd' bit stream in the routine count of FIG. 2C is completely independent of the current states of the remaining others of the 'a'–'c' bits. The latter 'd' bit is simply a NOT of its previous state.

With regard to the pseudo-randomness shown in FIG. 2D, note that each of the 'a'–'d' IRUT's is excited by a 1-clock pulse long high, a 2-clock pulses long high, a 3-clock pulses long high, a 1-clock pulse long low, a 2-clock pulses long low, and, if wrap around is allowed past the 16th clock to accommodate the 'c' line, a 3-clock pulses long low. It is within the contemplation of the invention to run the illustrated sequence in reverse time order (D, C, 2, 4, . . . 6, 0) and/or to start the 0 clock phase at any other value besides ABCD=0000 and to thereafter wrap forward or backwards in an orderly manner through the illustrated sequence. It is also within the contemplation of the invention to use like, but other sequences that provide at least a 1-clock pulse long high, a 2-clock pulses long high, a 1-clock pulse long low, and a 2-clock pulses long low. It is further within the contemplation of the invention to use like, but other sequences, where more state bits are available (e.g., more than the four a, b, c, d bits) and where the sequences further provide on each IRUT, a 4-clock pulses long or longer excitation-low and a 4-clock pulses long or longer excitation high in addition to, or in replacement of one or more the above described 1, 2, 3-clock pulses long lows and highs.

Wide inter-bit cross-dependence is one attribute that a practitioner should strive for when defining an interconnect-challenging sequence. (Many different such sequences may be formulated and used in a battery of tests.) Uniform spread of excitation frequencies at each verification point (Aa, Ab, . . . Dc, Dd) is another attribute that a practitioner should strive for when defining interconnect-challenging sequences. But those features by themselves may not be enough. The 'ideal', or close to ideal sequence(s) may have additional or overriding characteristics. Ultimately, each formulated sequence should provide for near 100% defect-detection coverage for not only single point defects (defects that occur only by themselves, one at a time) but also for more likely ones of double, triple and further such multiple defects (defects that each occur in unison with one or more other, defects). The ideal, or close to ideal sequence(s) should also provide for full defect detection with a minimized number of readouts. In other words, if a first defect throws its sequencer out of phase at a Jth clock cycle, one doesn't want to see a second, concurrent defect throwing the sequencer back into phase at a Kth clock cycle in a manner such that when a readout is taken at a later, Nth clock cycle, it appears that the sequencer has remained in phase with the expected sequence and it therefore appears that the under-test, interconnect resources are free of defects even though they are not.

Computer simulation may be used to identify better ones of possible sequences in a trail and error method. In such a method, a simulation model of the FPGA under-test is constructed with its logic blocks configured to implement sequencers such as shown in FIG. 2A (or as shown in below-described FIGS. 3A–3C). Likely ones of single defects such as stuck-at lines, stuck routers, etc. are introduced into the simulation model one at a time while a particular, IRUT excitation sequence (proposed sequence) is being tested for effectiveness. The simulation computer or the user should keep track of which clock cycle in the proposed sequence turns out to be a prime one where substantially most of the defects are caught, how many are so caught, what the real world likelihood of the caught and missed defects are, and, if possible, which additional one or two of the clock cycles catch the defects missed by the prime catching cycle. The simulation tests should then be repeated while double-defects of different kinds are introduced and the same statistics are collected. Then the likeliest of triple faults and so on should be introduced and again, the same statistics collected. Then the same should be repeated on a newly proposed sequence and the results of the two tried-sequences should be compared to see which has better prime and ancillary catch statistics. The better sequence is moved toward the top of the list, and the worse one is bubbled towards the bottom. A yet newer sequence is proposed and the comparison is again repeated in search of those sequences or combination of sequences that provide 100% or nearest-100% defect detection while requiring the fewest number of readouts. Note that each new sequence implies a corresponding re-programming of the FPGA because the sequence is defined by the configuration of the FPGA's LUT's. Reprogramming tends to take up a majority of overall test time. So we want to have as few re-programmings as possible while still providing for 100% or nearest-100% fault coverage. Read-outs also take up test time. So we want to have as few readouts as possible per sequence while still providing for 100% or near-100% fault coverage.

Figure 2E:
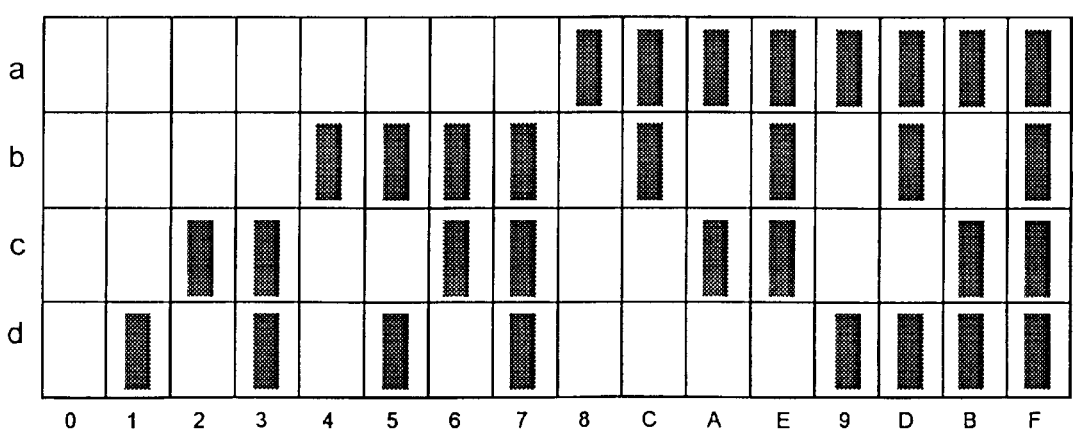

One particular sequence that has been found to be fairly effective and was rooted out by way of the above trial and error method is identified here as the second half, role reversal sequence and is shown in FIG. 2E. This sequence was developed for the system shown in FIG. 3A. Using hexadecimal notation, the role reversal sequence may be described by the following forward order of state values: 0, 1, 2, 3, 4, 5, 6, 7, 8, C, A, E, 9, D, B, F. Note that after the 7 count, the 'd' bit starts acting more like an MSB while the 'b' bit starts to act more like an LSB, hence the name, role reversal. For the illustrated role-reversal sequence (FIG. 2E), it was further found that three readouts at just the 12th, 13th and 14th of the illustrated 1st through 16th clock cycles were sufficient to catch a great majority of simulated ones of likely defects such as stuck-at high/low lines, stuck-at open/closed routers, broken lines, shorted lines, etc . . . . In other words, no readout was necessary in the first through eleventh clock cycles because an error caught in one of these would propagate itself into at least one of the 12th, 13th and 14th clock cycles without a second defect throwing the sequencer back into expected phase. It was found unnecessary to bother with clocking the circuit through the 15th and 16th clock cycles because the errors would have been caught in the readouts of one of the 12th, 13th and 14th clock cycles. Accordingly, a single sequence was found for the below-described embodiment of FIG. 3A that provides near-100% fault coverage using just 3 current-state readouts.

Of course, it is not possible to boldly declare here that the role-reversal sequence would provide such good defect-capture rates all by itself for all possible formulations of FPGA interconnect. Each FPGA formulation should be tested with the above, trial and error method or an equivalent to see what works best for that formulation. What we have set forth here are the sought-after objectives, namely: (a) trying to find the smallest number of sequences (and thus smallest number of FPGA re-programmings) that provide 100% or nearest-100% fault coverage. A secondary objective is to (b) identify sequences that will provide the desired 100% or nearest-100% fault coverage with as few readouts as possible per sequence. With this, we can minimize re-programming time and readout time, thereby shortening the overall time consumed for testing FPGA's on a mass production basis.

Referring again to FIG. 2A, and more specifically to the one or more feedback transmission paths that are formed from each given, excitation source point (e.g., 251) to corresponding, propagation detection points (e.g., Aa, Ba, Ca, Da) for a current-state bit (e.g., QA), it can be seen that many different types of interconnect resources may lie serially on and/or partially in parallel with each such a feedback path. Consider feedback path 256. If all is well, its sourced, excitation bit signal, QA flows from respective source point 251 to detection point Aa of LUT 250, and in so doing, radiates out through conduction structure 257, IRUT 210a and radiates out onto offshoot structure 257 and tripod structure 252. Tripod symbol 252 is included to indicate that the sourced, current-state bit signal QA flows not only from source point 251 to the 'Aa' detection terminal of LUT 250, but also to the respective 'a' input terminals of LUT's 260, 270 and 280; where such input points are respectively designated here as Ba, Ca and Da. The attributes described herein for the first branch 256 may apply equally to the other three flow and/or offshoot branches of signal QA as represented by tripod symbol 252.

In order to verify that a given part of IRUT 210a, such as conductor 213a, is not broken open or has another, like defect for impeding serial signal transmission, it is necessary that the specific and under-test conductor (e.g., 213a) be situated serially in the feedback path 256 so as to force the sourced, test signal QA to flow serially through that under-test conductor 213a. It is further required that the configured feedback path 256 not allow the test signal QA to find an alternate route by way of which the QA signal might circumvent conductor 213a and nonetheless reach detection point Aa. (This latter statement, of course, is made under the assumption that we are testing for serial discontinuities and that there is negligible likelihood of a double defect wherein conductor 213a is undesirably broken open while another defective conductor provides an alternate route by way of which the QA test signal can get around the broken-open line and nonetheless reach the verification point Aa.) Clearly, if there is a segment of the feedback path 256 which forms a parallel routing circuit of two or more parallel-connected conductor segments, such as is represented by symbol 257, then the serial continuity of each of these parallel-connected conductor segments cannot be verified with the illustrated FPGA configuration. Another FPGA configuration should be provided at another time for placing one or more of the conductor segments of structure 257 in a series-connected topology so as to verify their respective continuities.

The lack of serial organization does not mean that structure 257 is not being tested. If one or more of the parallel-connected segments of structure 257 is inadvertently shorted to another wire so as to pull the feedback line 256 to ground or to Vcc, then such a defect will probably be detected by virtue of the inability of the QA test signal to arrive intact at detection point Aa. Similarly, if there is a dead-end offshoot 257a on feedback path 256, the continuity of that offshoot 257a cannot be verified in the illustrated configuration, but a short circuit to that offshoot 257a may nonetheless be detected by virtue of the sequencer not sequencing as expected.

In laying out the feedback paths 256, 266, 276 and 286 of the sequencer, one should consider a number of competing goals. It is desirable to serially situate within a given feedback path such as 256, or tack on as non-serial offshoots, as many simultaneously-testable interconnect resources as may be possible for simultaneously testing with the radiation of a single test signal such as QA. Thus, it is shown for purposes of example in second feedback path 266, that an additional resource set 210f2 is provided serially between the QB sourcing point 261 and detection point Bb, as well as resource set 210f, where each such resource set comprises a conductor-under-test and a PIP-under-test. The drawback to such ambitious and simultaneous testing of multiple resources is that one may inadvertently create an undesired, but not defect-produced, short circuit such as 253 between a first feedback path (e.g., 266) and another of the feedback paths (e.g., section 252 of path 256). Accordingly, when configuration of the feedback paths 256–286 is planned, care should be taken to avoid configurations which create short circuits of the not defect-produced kind (253) between the respective feedback paths of each of the independent test signals QA, QB, QC and QD. At the same time, efforts should be made to include in the series-connected portion and non-serial offshoot portions of each such independent path as many IRUT's (e.g., 210f, 210f2) as possible for simultaneous testing under a single configuration of the FPGA.

We will now explore different ways of initializing a given sequencer to begin its sequencing at a particular sequential state or phase. The state-storing registers (255, 265, 276, 285) of the sequencer-implementing logic block(s) will typically have one or both of a programmable SET and RESET (RST) capability for allowing one or a group of such registers to be set or reset on a global or local basis. One example of such a SET/RST mechanism 202 is shown for register 255. Although not shown, it is understood that a similar programmable SET/RST mechanism is respectively provided for each of the other remaining registers 265–285. The "X" symbol in multiplexer icon 202 indicates that a received global or local reset signal may be programmably made to function as a set signal for the respective register instead of serving as a reset signal. Given programmably-definable SET/RST options of these kinds, one or the other or both of the global or local reset signals may be used to quickly switch registers 255–285 into a desired initial state.

Once initialized, the respective state-storing registers 255, 265, 275 and 285 may be clocked by a supplied clock signal 205 to thereby advance the sequencer to the next and further states. In the embodiment 200 of FIG. 2A, the implementing FPGA includes an assortment of clock-delivery resources including one or more global clock lines that extend continuously adjacent to all its logic blocks for providing low-skew synchronization among all the logic blocks. The clock delivery system may also include continuous longlines that each extend horizontally or vertically respectively among a row or column of the logic blocks for providing low-skew synchronization among the logic blocks of its given row or column. Clock signals may also be propagated through different ones of the general interconnect lines of the FPGA. PIP symbols 258, 268, 278 and 288 represent respectively the local selection means of registers 255, 265, 275 and 285 for acquiring their respective clock signals from either the global or local interconnect resources of the FPGA. At least one of the FPGA testing configurations preferably uses a single one of the global clock lines for delivering a same clock pulse to all of the state-storing registers 255–285. The clock signal may be supplied from an external pad or pin 204 of the FPGA or it may be generated by an on-chip phase lock loop (PLL).

Another possible method for initializing the state-storing registers 255–285 is by serially shifting into them an initial-state stream by way of a serial shift chain that includes FPGA pin/pad 201 as a bit input means. In one particular embodiment, the serial shift chain is formed by a series of shadow registers 254, 264, 274 and 284. The shadow registers 254–284 may be used to transparently copy the contents of respective ones of the main registers 255–285 and to thereafter serially shift out those copied contents without altering the current-states of the main registers 255–285. The copied and shifted-out results may then be seen on a shadow readout pin or pad such as 229.

Referring to FIG. 2B, a particular implementation 290 of the main and shadow registers is illustrated. A representative one of the main registers is shown at 255a while a corresponding one of the shadow registers is shown at 254a. Shadow-input multiplexer 294 enables of plurality of modes for the shadow registers including a first mode in which the Q output of main register 255a is copied by way of line 291 into the D input of shadow register 254a. In a second mode enabled by multiplexer 294, the D data input of shadow register 254a is coupled to a serial input (SI) receiving terminal of multiplexer 294. The Q output of shadow register 254a provides the serial out (SO) signal for the next subsequent shadow register when the latter is also in a shadow shift mode. A shadow shift clock, which is independent from the clock signal (CLK) 297 of the main register 255a, is provided on line 292. A shadow selection control line 293 is used for switching the shadow input multiplexer 294 between at least the copy and serial shifting modes.

The illustrated shadow loading line 295 is optional and may be used for copying a serially-shifted-in seed state into the main registers 255a by way of main input multiplexer 296. Another input of the main input multiplexer 296 receives the Di signal from a corresponding 4-LUT (e.g., 250). Yet another input of the main input multiplexer 296 receives a feedthrough signal (FT) which is acquired by a local input switch matrix (ISM) but bypasses the local 4-LUT (e.g., 250). The selection control of multiplexer 296 receives a main input mode selecting signal that determines on either a static or dynamic basis which input (Di, FT, Seed) is active. Register-bypass multiplexer 299 is user-programmable (as are other signal routing elements such as 202a, 202b, 258a–c, 259a–b) so that the Di signal may be routed to the QA terminal combinatorially rather than being passed through main register 255a.

The clock input line 297 and clock enable bar (CEB) line 298 of main register 255a can respectively and selectively acquire their respective CLK and CEB signals from adjacent interconnect lines. PIPs 258a, 258b and 258c, for example, represent the ability of the clock signal to be acquired from an adjacent global clock line (G-CLK), an adjacent horizontal or vertical MaxL line (H/V-CLK) or an adjacent shorter-haul interconnect line (L-CLK). Different ones of these PIPs 258a–258c may be tested with a given FPGA configuration when the configured sequencer of FIG. 2A steps through its successive and interconnect-challenging states.

A possible SET and RST support structure for main register 255a is also shown in FIG. 2B. Element 202a represents a user-programmable multiplexer for disabling the reset signal or for selecting the global reset signal. (G-RST) or a local reset signal (L-RST) which is selectively acquired by one of PIPs 259a and 259b from adjacent interconnect lines. Element 202b represents a user-programmable crossover switch which allows the reset signal output by multiplexer 202a to be used for setting register 255a instead of resetting it. The unused one of the RST and SET terminals receives a logic '0'. The combination 290 of main register and shadow register as shown in FIG. 2B represents but one possible embodiment for carrying out the general concepts of the present invention. Alternate embodiments will be apparent to those skilled in the art, given the above disclosure, and such alternate embodiments may include those that use only the main register 255a for both state sequencing and result-readout. This alternative, however may not preserve the current state of the sequencer, thereby necessitating a serial write-back of the output state after each serial readout. Such delays may not be desirable in mass production testing environments.

Figure 3A:
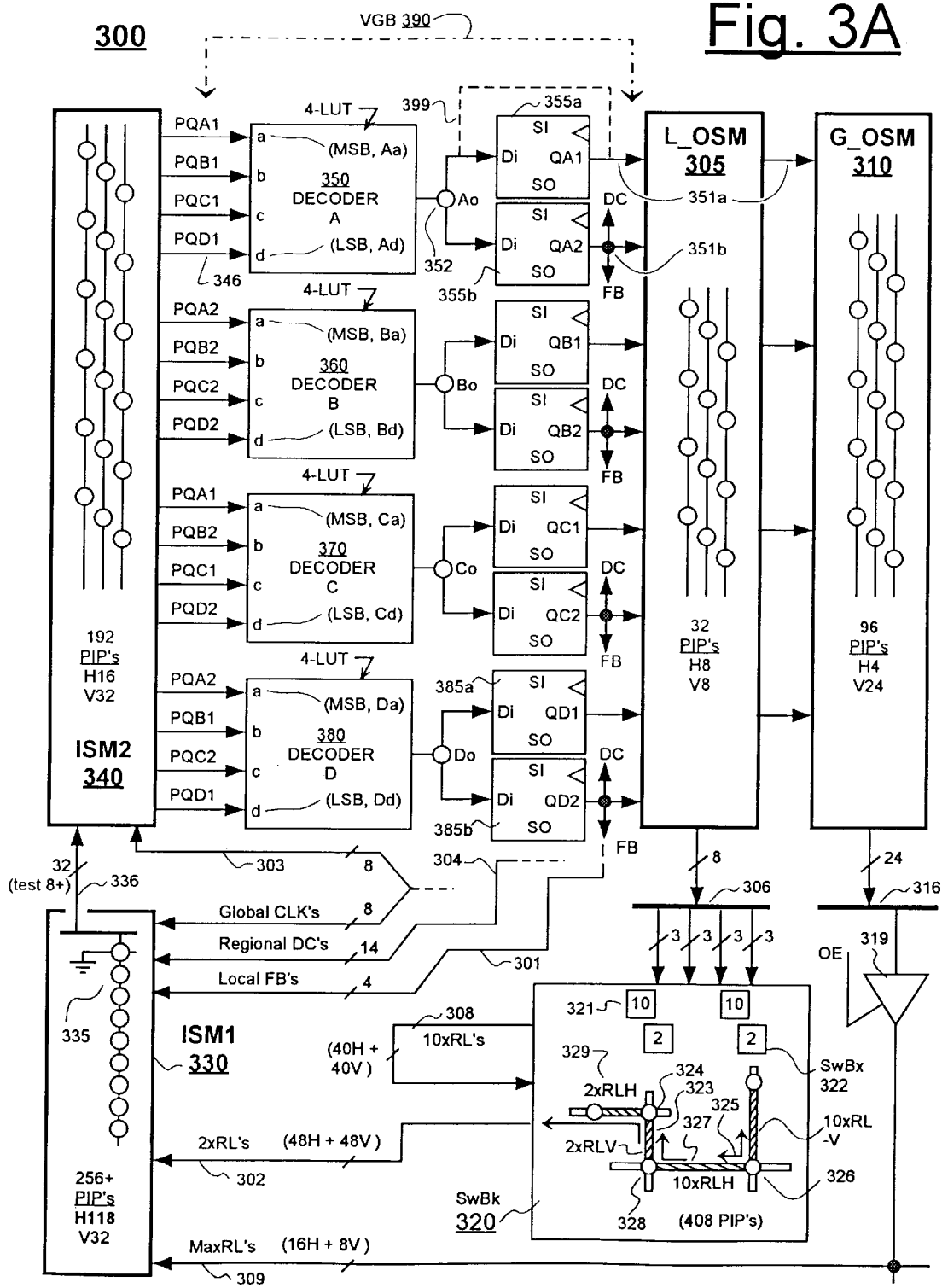
FIG. 3A illustrates a second embodiment for implementing interconnect-challenging sequencers in accordance with the invention.

Referring to a second embodiment 300 shown in FIG. 3A, here the FPGA resources are more complicated than those of FIG. 2A and hence the usability of the technique introduced in FIG. 2A may be less apparent. Nonetheless, the same basic principles apply. This time, in embodiment 300, each 4-LUT (e.g., 350) has at least two registers (e.g., 355a, 355b) associated with the LUT's output and each of these associated registers may have its own access to various interconnect resources. For example, output 351a (QA1) of register 355a might be connectable to both of a Local Output Switch Matrix (L-OSM) 305 and a Global Output Switch Matrix (G-OSM) 310. By contrast, output 351b (QA2) of associated register 355b might be connectable to the L-OSM 305, but not directly to the G-OSM 310. In addition, output 351b (QA2) might be connectable to direct-connect (DC) and feedback (FB) resources of the FPGA integrated circuit device (300) while output 351a (QA1) is not so connectable. These non-symmetrical access constraints are, of course, just examples. It is within the contemplation of the invention to test LUT-associated registers (355a, 355b, . . . , 385b) even in cases where their access capabilities are symmetrical.

Continuing with the description of the asymmetrical example, the L-OSM 305 in its turn, may connect by way of multiple buses 306 (each 3 bits wide in one embodiment) to a switching block (SwBk) 320 that has multiple switchboxes (SwBx) such as 321 and 322 provided therein. The switchboxes (e.g., 321, 322) provide programmably-definable signal routes through, here-defined, 'double-reach length' (2×RL) VGB-interconnecting lines 302 and 'deca-reach length' (10×RL) VGB-interconnecting lines 308.

Although not fully shown in FIG. 3A, a 'VGB', as the term is used herein, is a Variable Grain Block structure which, in one set of embodiments, includes at least four user-programmable LUT's such as 4-LUT's 350–380 and at least eight associated registers such as 355a–385b. Sectional line 390 indicates the boundaries for one such VGB in FIG. 3A. See also FIG. 3B which shows a plurality of VGB's 390a, 390b and 390c within the surrounding environments of their respective L-OSM and G-OSM.

Figure 3B:
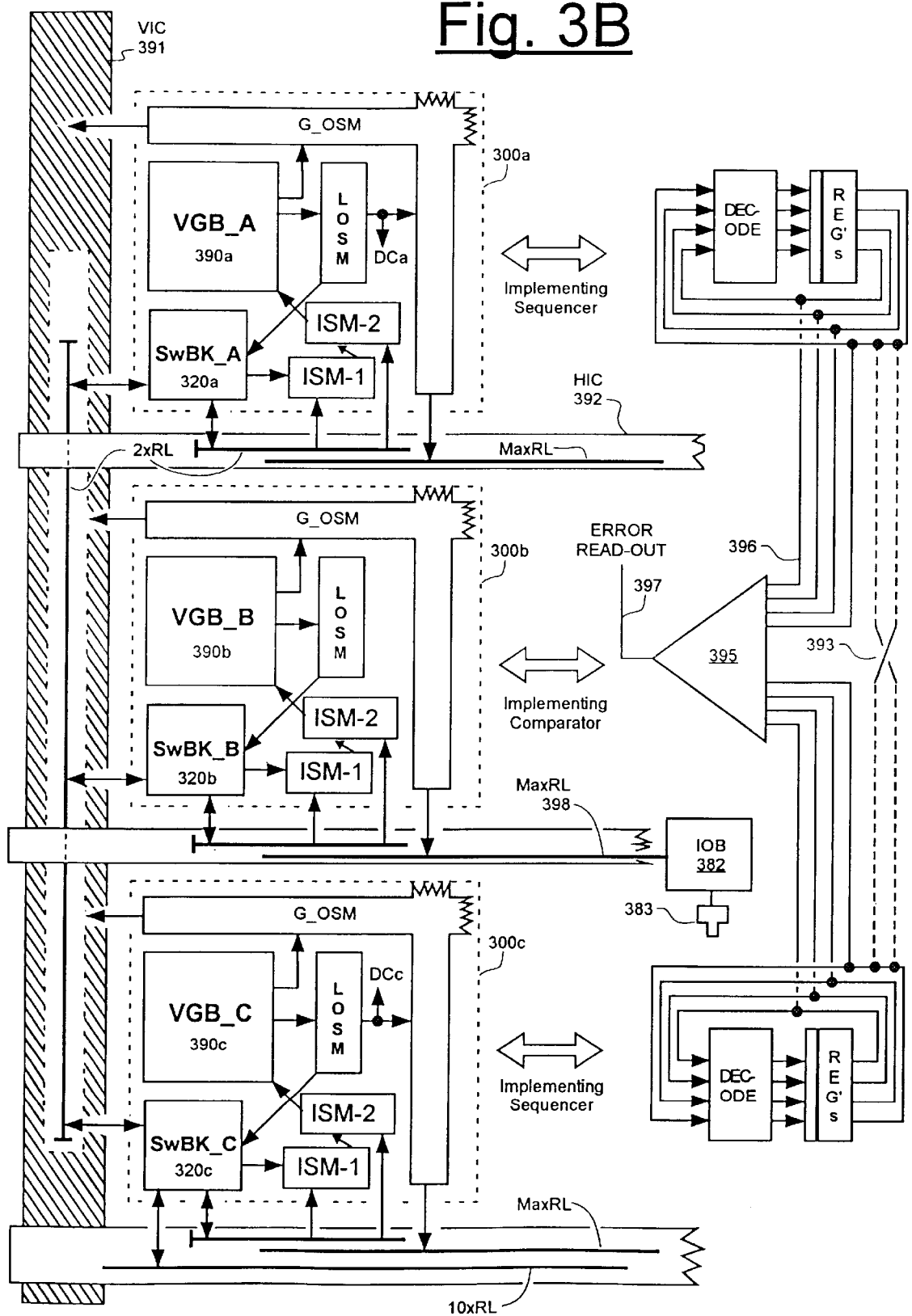
FIG. 3B illustrates a first set of variations on the themes of FIGS. 2A and 3A.

The term 'double-reach length' (2×RL), as the term is used herein, refers to a continuous conductor that extends adjacent to three Variable Grain Blocks (VGB's). Each 2×RL line allows an adjacent one of its 3 VGB's to broadcast a signal to the other 2 of its adjacent VGB's, hence the name 'double-reach' length line. The three VGB's serviced by a given 2×RL line may lie adjacent to one another in a same row of VGB's or a same column of VGB's. In FIG. 3B, a 2×RL vertical line is shown within Vertical Interconnect Channel (VIC) 391. It is seen there that a 2×RL line allows any VGB (e.g., 390a) to talk, through its respective switchblock 320 to any two other VGB's (e.g., 390b, 390c) that are adjacent to the given 2×RL line.

The term 'deca-reach length' (10×RL), refers herein to a continuous conductor that has a length continuously extending by eleven adjacent VGB's. Each 10×RL line allows any one of its adjacent VGB's to broadcast a signal to ten other VGB's that are adjacent to that 10×RL line. While it is not directly shown in FIG. 3B, the concept of the 10×RL can be easily understood by pretending that the illustrated vertical 2×RL line of VIC 391 instead stretched linearly and adjacent to a total of 11 VGB's. A difference between 2×RL lines and 10×RL lines in the illustrated embodiments of FIGS. 3A–3B however is that 10×RL lines there do not input directly into a below-described, ISM-1 structure 330.

Referring again to FIG. 3A, although it is not fully shown therein, each of the plural registers, 355a, 355b, . . . , 385b associated with each of the LUT's 350–380 may be programmably bypassed. This capability is indicated for the case of register 355a by dashed path 399 and line 399 corresponds to multiplexer 299 of FIG. 2B. It is understood that each of remaining registers 355b–385b has a similar, user-programmable bypass mechanism.

The G-OSM 310 may connect by way of multiple lines 316 (there are 24 such lines in FIG. 3A) to a corresponding set of tristateable longline drivers 319. Each of drivers 319 may have a respective output coupled to a respective one of plural longlines (MaxRL lines) 309. In the embodiment of FIG. 3A, there 16 horizontal longlines (16H) and 8 vertical longlines (+8V) that are drivable by a corresponding set 319 of 24 tristate drivers.

The illustrated longlines (MaxRL lines) 309, and 2×RL lines 302, along with other kinds of illustrated lines (Local FB's 301, Regional DC's 304, and G-CLK's 303) feed into a first, user-programmable, Input Switch Matrix (ISM-1) 330. Output wires 336 of ISM-1 feed into a second user-programmable, Input Switch Matrix (ISM-2) 340. Output wires 346 of ISM-2 feed into 4-LUT's 350, 360, 370 and 380.

A problem that is originally presented for the FPGA embodiment 300 of FIG. 3A is how to efficiently test all of its diversified interconnect resources. Note in particular that the 10×RL lines do not feed directly into ISM-1 (330), but instead couple programmably to the switch block 320. Understand also, that even though a solution is already shown in FIG. 3A, inputs of the plural registers, 355a, 355b, etc., associated with each of the LUT's do not inherently each couple to the LUT outputs Ao–Do by way of VGB-internal routing means such as 352. Each of the associated registers, 355a–385b might instead have been programmably coupled to a respective feedthrough line for example. However as is already seen, VGB-internal and configurable, register-input routing means such as 352 are provided between the outputs (Ao–Do) of each of 4-LUT's 350, 360, 370 and 380 and their respective registers 355a–385b and these register-input routing means (352) are each programmed to route the respective Ao, Bo, Co and Do output signals of the LUT's each to the respective ones of plural registers, 355a, 355b, etc., as shown to thereby define a sequential state machine with redundant state-holding registers.

When their respective registers 355a–355b are clocked and enabled, the respective QA1 and QA2 outputs will both source a current-state bit Ao that is being presented to the Di inputs of the registers from respective LUT 350 (which LUT is configured to implement decoder A). Similarly, the respective QB1 and QB2 outputs associated with LUT 360 (which LUT is configured to implement decoder B) will both source a current-state bit Bo at that clocked/enabled time. And yet further, the respective QC1 and QC2 outputs associated with LUT 370 (which LUT is configured to implement decoder C) will both source a current-state bit Co at that time while the respective QD1 and QD2 outputs associated with LUT 380 (which LUT is configured to implement decoder D) will both source a current-state bit Do.

In each of plural, test-enabling reconfigurations of the FPGA 300, selected ones of the interconnect lines and PIP's within respective ones of L-OSM 305, G-OSM 310, SwBk 320, ISM-1 (330) and ISM-2 (340) may be programmed such that each of the decoder-implementing LUT's 350, 360, 370 and 380 gets full information about the current state: QA, QB, QC, QD of the sequential state machine's registers 355a, 355b, ..., 385b. More specifically, selectable ones of the illustrated interconnect resources 305–340 should be so configured (programmably that is) that each of the 'a', 'b', 'c', 'd' input terminals of LUT's 350–380 respectively gets one of signals PQA1 or PQA2, PQB1 or PQB2, PQC1 or PQC2, PQD1 or PQD2; where PQA1 should be the interconnect-fedback version of the QA1 signal, PQA2 should be the interconnect-propagated version of the QA2 signal, PQB1 should be the interconnect-propagated version of the QB1 signal, ..., PQD2 should be the interconnect-propagated version of the QD2 signal. There are sixteen potential, signal-verification points provided by the respective input terminals: Aa, Ab, ..., Dc, Dd of LUT's 350–380. Where possible, at least eight of these verification points, Aa–Dd, should be connected to each receive a respective and unique one of the interconnect-propagated eight signals PQA1, PQA2, PQB1, ..., PQD2 as transmitted by a corresponding unique set of independent feedback paths formed through programmable interconnect resources 305, 310, 319, 320, and/or 330 plus 340. If this is so done, then as the implemented sequential state machine (sequencer) steps successively through its unique 16 or fewer states, there will be at least eight independent feedback paths being simultaneously tested at verification points such as Aa, Ab, ..., Bd for serial continuity and for other attributes that indicate the interconnect is free of defects.

It is worthwhile to note here that not every testing sequence can satisfy the suggested use of at least eight unique verification points. In some cases, the number of unique bits that may be output in a given clock signal is limited by the specific architecture of the FPGA chip. For example, in the illustrated embodiment 300 of FIG. 3A, the bits for testing a respective set of four FB lines or a respective set of four DC lines may only come from a corresponding specific set of four registers, namely those with outputs denoted as: QA2, QB2, QC2 and QD2. In cases such as these, the number of verification points Aa–Dd which are receiving respective and unique ones of interconnect-propagated excitation signals may be as small as four or less. In certain situations, however, it may be possible to add to this small number of unique excitation signals by simultaneously testing the MaxRL lines 309 with signals that originate at outputs QA1, QB1, QC1, and QD1 of the illustrated registers and which pass through global output switch matrix 310.

If the interconnect feedback paths can support more than eight independent serial paths, then those additional paths may also be simultaneously tested at yet others of the available, 16 verification points such as Aa–Dd. In one embodiment, it is possible to establish at least ten independent feedback paths through an inter-ISM's bus 336 provided between ISM-1 (330) and ISM-2 (340). Accordingly, at least ten independent serial feedback paths may be simultaneously tested in that embodiment. Although FIG. 3A shows 32 vertical lines extending in bus 336 from ISM-1 (330) to ISM-2 (340), the bottleneck for forming a larger number of independent feedback paths may occur further upstream, in the switchblock 320. A set of 40 horizontal and 40 vertical deca-reach length lines (10×RL's) 308 pass through switchblock 320 but do not connect directly to ISM-1 (330). In order to test the continuity of deca-line segments (e.g., 327), one may inject an excitation signal by way of bus 306 into a given deca-switchbox 321 for coupling that excitation signal to an injection point 326 on the under-test deca-line 327. A spaced-apart extraction point 328 of the deca-line 327 may be used to programmably couple the extracted signal to a set of vertical and horizontal double-reach lines, 323 (2×RLV) and 329 (2×RLH). A programmably-configurable extraction point 324 on one of the double-reach lines (323) may then be used to couple the excitation signal onto ISM intake bus 302, which bus continues into the first input switch matrix 330. Thus, continuity of different parts of respective deca-reach lines (e.g., 327) may be tested with test configuration 300 even though the 10×RL lines do not directly couple to ISM-1 330.

Referring to the interior of box 320 in FIG. 3A, a preferred continuity testing route through switchblock 320 is indicated by arrowed path 325. One of the wires from bus 306 connects to a so-called deca-switchbox such as 321. Within the deca-switchbox 321 there is one or more PIP's 326 which may be used to inject an excitation signal into both a vertically-extending deca-reach line (10×RLV) and into a horizontally-extending deca-reach line (10×RLH). A connection exists between the deca-switchbox 321 and a corresponding double-switchbox 322 for continuing the excitation signal into a vertically-extending double-reach line (2×RLV) and also through a horizontally-extending double-reach line (2×RLH). That double-reach line (2×RLH) then extends by way of bus 302 into input switch matrix 330. This type of configuration 'lights up' four different conductors at one time with an excitation signal. Although the illustrated path 325 tests the continuity of a horizontal 10×RL line 327, other like configurations may be used to similarly test the continuity of vertical deca-reach lines (10×RLV). The only requirement for FPGA's with the illustrated architecture is that the propagated excitation signal flow out through a 2×RL line (or an equivalent) because the illustrated architecture does not allow 10×RL lines to link directly to the ISM-1 (330).

Within ISM-1 (330) there are a plurality of thirty-two 9:1 multiplexers of which one is shown at 335. One of the PIP's of the 9:1 multiplexer (335) may be used to selectively ground the vertical output line of that multiplexer (335). The remaining eight PIP's are distributed for selectively acquiring a signal from one of the plural horizontal lines entering ISM-1 (330). These horizontal lines include those from the local feedback lines (FB's) bus 301, the horizontal and vertical 2×RL buses 302 (48 Hwires+48 Vwires), a global clocks bus 303 (8 independent global wires), a set of regional direct-connect wires 304, and longline buses 309 (16 Hwires+8 Vwires). Those of the PIP's on the 9:1 multiplexer 335 that can be configurably programmed to select a signal from one of the 2×RL lines entering ISM-1 (330) may be activated to continue the excitation signal of path 325 through the ISM-1 and through its vertical bus 336 into ISM-2 (340). In the illustrated embodiment, ISM-2 (340) comprises 16 horizontal lines intersecting with 32 vertical lines, thereby providing 512 intersection points. These are partially populated by 192 PIP's. Different ones of the PIP'S, the horizontal lines, and the vertical lines of ISM-2 may be tested in each configuration using the sequential state machine 300 and feedback paths illustrated in FIG. 3A. In similar fashion, ISM-1 has a plurality of 32 vertical lines intersecting with more than 100 horizontal lines where this large intersection matrix is partially populated by more than 256 PIP's. Various ones of these may also be tested during different configurations of the sequential state machine 300.

Within switchblock 320 there may be as many as 408 PIP's or more distributed in the double and deca-switchboxes (322, 321), as well as the corresponding 2×RL lines and 10×RL lines that extend from those respective switchboxes. Various ones of these lines and PIP's may also be tested during different configurations of the FPGA and by virtue of the excitation paths such as the 325 path described above. Often, however, not all of the lines and PIP's may be activated (lit up) at the same time because to do so would create unwanted (but defect-free) short circuits between lines being lit-up by adjacent VGB's that are each sequencing through their respective excitation states. Accordingly, the overall number of lines and PIP's that may be simultaneously tested in a given pre-programming of the FPGA is often limited by conflicts between adjacent VGB's that are simultaneously executing their sequential states and perhaps trying to light up a commonly shared 2×RL line or 10×RL line or a MaxRL line or another such shared interconnect resource.

This is a good spot in our discussion to point out the danger of running adjacent sequencers in phase with one another. Suppose there are two, neighboring versions of circuit 300 of FIG. 3A running precisely in phase with each other so that the QA1 output of the first version is bit-wise the same as the QA1 output of the second version on every clock tick. Suppose further that due to either a defect or an accidental sharing of a common interconnect line between the two versions of the sequencers, the PQA1 signal appears at expected verification points in both versions even though there might be an open-circuit type of defect in one of the feedback loops of the inadvertently shorted-together and adjacent sequencers. In such a case, one of the sequencers will be fooled into believing its feedback path is complete because it is receiving a bit-wise exact copy of the expected, propagated signal PQA1 from the excitation source point of the adjacent sequencer rather than from the excitation source point (QA1) of its own circuitry. Given this, it is worthwhile to have at least a few test runs wherein adjacent sequencers execute out-of-phase with one another or execute very different sequences from one another.

At the same time that PIP's and conductors of ISM-1 (330) and ISM-2 (340) are being tested, different combinations of PIP's and wires within local OSM 305 plus switchblock 320 may also be simultaneously tested, and/or different combinations of PIP's, tristate drivers, and wires of global OSM 310 and of bus 309 may also be simultaneously tested, because the latter interconnect resource groups (305/320 or 310/319) are configured to propagate their respective excitation signals (PQA1, PQA2, . . . , PQD2) into the ISM-1/ISM-2 combination. Accordingly, with each re-programming of the FPGA, multiple PIP's and conductors may be simultaneously tested. This helps to reduce the total number of needed re-programmings of the FPGA 300 for thoroughly testing all of the PIP's, conductors and other parts of the FPGA's interconnect resources.

The hierarchical routing structure provided by ISM-1 (330) and ISM-2 (340) also helps to reduce the total number of re-programmings required of the FPGA for providing thorough testing of the FPGA's interconnect resources. ISM-1 (330) has over 100 horizontal lines entering it. ISM-2(340) has at least 16 horizontal lines exiting therefrom. If, instead of using a hierarchical, dual ISM structure 330/340, signal routing had instead been provided by a single, non-hierarchical input switch matrix; where the latter ISM hypothetically has over 100 horizontal lines entering it and a hypothetical 16 vertical lines exiting it, then the number of tests for verifying that all possible combinations of useable wires and PIP's operate correctly in all possible permutations of programming, can be astronomically large. However, with the hierarchical routing structure provided by ISM-1 (330) and ISM-2 (340), a much smaller number of permutations may be tested. This is so because the 16:1 horizontal multiplexers of ISM-2 (340) are each being serially tested at the same time that a corresponding one of the 9:1 multiplexers (335) in ISM-1 (330) is being tested. The number of permutations needed for thorough testing is significantly less than the case of the hypothetical, non-hierarchical ISM. Note that if the illustrated FPGA design (FIG. 3A) is scaled up to provide a larger number of interconnect wires, the advantage of a hierarchical input switch matrix structure 330/340 grows with respect to testability.

For testing the longlines 309, the respective output signals QA1, QB1, . . . QD1 are injected into the global output switch matrix 310 by wires such as 351a. In the illustrated embodiment, there are four horizontal wires intersecting with 24 vertical wires inside the intersection matrix of G-OSM 310. These intersections are fully populated by 96 PIP's thereby allowing any VGB to drive any one or more of up to 24 tristate drivers 319 as desired. The output-enable (OE) terminals of those of the tristate drivers 319 that are under test are activated so as to form a feedback path from G-OSM 310, through bus 316, through the enabled tristate drivers 319, through corresponding ones of horizontal or vertical MaxRL lines 309 and then finally through the ISM-1 (330) and the ISM-2 (340) for completing the feedback path into verification points Aa, Ab, . . . , Dd of respective LUT's 350–380.

The feedback lines of bus 301 provide dedicated intra-VGB couplings between the outputs of LUT's or registers in the VGB to the inputs of other LUT's and/or registers of the same VGB. Continuity/operability testings in the embodiment of FIG. 3A is fairly straightforward for the FB lines and their related PIP's. The respective excitation signals QA2, QB2, QC2, QD2 are transferred by way of the local feedback bus 301 into ISM-1 (330). From there, the already described feedback path continues through bus 336 and ISM-2 (340) back to verification points Aa–Dd.

It has already been explained above that there are only four available source points for the FB lines in embodiment 300 while there are a much greater number, e.g., 16, of unique verification points Aa–Dd at the LUT inputs. For some patterns, it may be possible to use other kinds of lines such as in buses 302, 303 and/or 309 for providing 'filler' bits that supplement the limited number of unique DC source bits. Such use of 'filler' source bits from other types of lines can make the testing sequence more robust than if only the QA2, QB2, QC2 and QD2 source points are used for supplying interconnect-challenging excitation signals into the under-test interconnect loops. Conversely, when the 2×RL's and/or 10×RL lines are being tested, there may be test patterns wherein the FB wires can serve as 'filler' data suppliers for respective ones of verification points Aa–Dd that would otherwise not receive unique ones of propagated test signals PQA1–PQD2 while the 2×RL's and/or 10×RL lines are the ones that are primarily being tested.

Figure 3C:
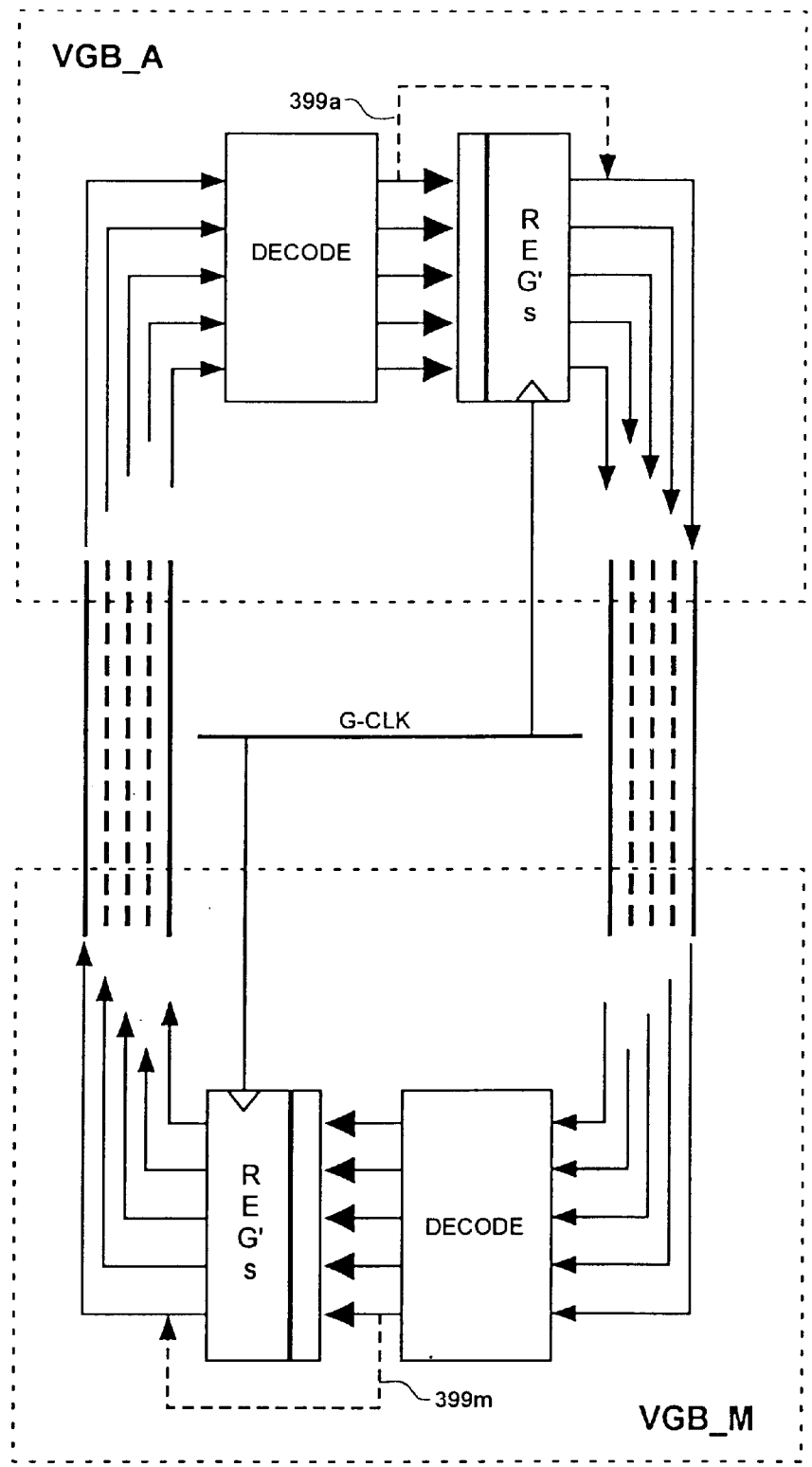
FIG. 3C illustrates a second set of variations on the themes of FIGS. 2A and 3A.

Verification of direct-connect lines is a little more tricky than verification of the FB lines. The FB lines remain within a single VGB. By contrast, the direct-connect lines (DC's) each receives an excitation signal sourced in one VGB (the one VGB that is dedicated for driving that one DC line) and then the DC line carries the excitation signal to different VGB's, namely those in the region surrounding the sourcing-VGB, those other VGB's being the ones to which the given DC line spreads out. So a sourcing-VGB cannot test its dedicated, driven DC line by itself. However, this is not as big a problem as it may seem because plural ones of VGB's may be configured to execute respective sequential state machines where the machines are all stepping in phase with one another (provided their interconnect is not defective). By cross-exchanging the DC wires of such in-tandem operating sequential state machines, one VGB can be verifying the continuity of the DC line driven by a second VGB and vice versa. Alternatively, larger loops with many VGB's in them may be created as is indicated by FIG. 3C. In FIG. 3B, a cross-exchange of direct-connect signals can be seen between VGB-A and VGB-C, which connection may symbolically be exemplified by optional cross-over-connection 393. The ISM-1 stage of VGB-C (390c) can be configured to selectively receive the DCa signal sourced by VGB-A (390a). Correspondingly, the ISM-1 stage of VGB-A can be configured to selectively acquire the DCc signal sourced from VGB-C. If sequential state machines 300a and 300c are operating in phase in FIG. 3B, then each can verify the sequential output states of the other.

Returning briefly to FIG. 3A, we will describe the testing of the global clock lines (303) and their associated PIP's in ISM's 330 and 340. A given first VGB can be programmed to produce signals that are output onto one of the global clock lines 303 of the integrated circuit device. The excitation signals produced by that first VGB may then be fed back to itself or to other VGB's for verification in a manner similar to that explained for the direct-connect lines. As such, the PIP's in ISM-1 and ISM-2 that selectively acquire signals from the global clock lines may be tested for operability.

As an alternative to having on-chip VGB's produce the signals that are sequenced through the under-test global clock lines (303), it is also within the contemplation of the invention to provide external sequencers outside of an under-test chip and to supply the sequencer output signals of these external sequencers through dedicated clock-receiving paths of the under-test device for propagation onto the global clock lines (303) inside the device. Verification of the correct propagation of the excitation signals may be carried out in basically the same manner by verification points of on-chip LUT's.

Referring again to FIG. 3B, an alternate method for obtaining faster readout of pass/fail test results is shown. Substantially identical sequential state machines, 300a and 300c are implemented respectively by VGB-A (390a), VGB-C (390c), and their respective interconnect resources. Cross-exchange of state feedback signals is optionally permissible as indicated by dashed lines 393. This cross-exchange can be used for testing the full continuity of a 2×RL lines such as the one shown inside VIC 391. An excitational test signal can be injected from SwBk-A (320a) into one terminal end of the illustrated vertical 2×RL line while the line-propagated result is acquired by SwBk-C (320c) from the opposed terminal end and fed into a verification point within VGB-C (390c). If the vertical 2×RL line is broken or stuck low or stuck high, sequencer 300c should responsively be thrown off its expected phase and the defect should thereby be detected. It is not a good idea to use adjacent and parallel 2×RL lines for signal exchange 393 because a common defect mechanism (e.g., a lithography created break or short) may likely affect both in a similar fashion. On the other hand, if the tested conductors of signal exchange 393 are orthogonal to one another (e.g., a horizontal 2×RL line and a vertical 10×RL or MaxRL line) then the likelihood of a shared defect is fairly small. In the latter case, logic block area 300b may be used to implement a comparator 395. The implemented comparator 395 compares plural current-state bits of the first sequencer 300a against corresponding plural current-state bits of the second sequencer 300c. If there is a discrepancy, that may indicate that either one of the first and second sequencers, 300a and 300c has been thrown out of phase with the other due to a bad wire or bad PIP in one of the sequencers; or that there is a defect in one or more of the input wires 396 or PIP's of the comparator 395 implemented by logic block area 300b.

Error readout 397 from the comparator 395 may be implemented by a variety of means including use of shadow registers (not shown) to nondestructively shift out current state bits. Error readout 397 may alternatively propagate through a MaxRL line such as 398 into an IOB 382 that can couple to that MaxRL line 398. The IOB then provides the error readout signal on a corresponding pin or pad 383. In the embodiment of FIG. 3B, groups of at least 8 VGB's each in a column of VGB's (e.g., 390a–390c) share a common G-OSM for connecting to a common group of at least 8 vertical MaxRL lines in their adjacent VIC (391). Similarly, groups of at least 8 VGB's each in a row of VGB's share a common G-OSM for connecting via tristate drivers (319) to a common group of at least 8 horizontal MaxRL lines in their adjacent HIC (Horizontal Interconnect Channel, 392). Because of this, a single pad or pin 383 may continuously serve as a test readout point even as different bands of VGB rows or columns are reconfigured to take on swapped roles of comparators (395) and sequencers (330a, 300c). Alternatively, plural numbers of IOB's (382) and pins/pads may be used simultaneously for outputting respective error readout signals from respective comparators (395).

While the comparator-based implementation of FIG. 3B assumes that sequencers 300a and 300c are stepping through a same interconnect-challenging sequence and in phase with one another, it also within the contemplation of the invention to cause neighboring and respective sequencers to purposefully step through respectively different interconnect-challenging sequences or through same interconnect-challenging sequences but out of phase with one another so as to more aggressively test for crosstalk between the neighboring sequencers. The latter approach is more difficult to use because test users have to keep track of where in each different sequence, each sequencer is supposed to be during readout pauses. Also, it may be necessary to have more readout pauses than if a single sequence is being stepped through uniformly and in phase throughout the FPGA's array of VGB's.

FIG. 3C shows yet another implementation in accordance with the invention. The feedback loop of an FPGA-implemented sequencer need not comprise just one VGB and its adjacent interconnect resources. A loop can be composed of plural VGB's and can use one or more of the registers in each VGB for storing current state bits. Although FIG. 3C shows just VGB-A and VGB-M positioned within a feedback loop with their respective register sets inline with the loop, it is within the contemplation of the invention to use more such combinations of decoder-implementing LUT's and registers in each loop and/or to activate the register-bypass mechanisms, 399a or 399b, of a subset of these LUT's as may be useful for testing the register-bypass mechanisms (399a, 399b) and/or for creating different excitational patterns in various segments of each of the testing loops. If VGB-A and VGB-M are widely spaced apart (e.g., 10, 20 or more rows/columns apart) they may be used to test in one FPGA configuration, the end-to-end continuities of 10×RL lines. Synchronized clockings of the respective register sets of each LUT-implemented decoder may be provided by way of the global clock wires in the FPGA.

Note in FIG. 3B that the decoder-implementing LUT's are shown to be five inputs wide. Narrower or wider decoder-implementing LUT's may be used as may be permitted by the architecture of the under-test FPGA. Wider LUT's allow for more varied excitation patterns as was explained for FIGS. 2C–2E.

FIG. 4A illustrates a perspective view of a computerized testing system 400 that may be programmably configured to operate in accordance with the invention. This view may be used to reiterate some of the basic discussions provided above about testing a stream of FPGA dice or of packaged chips in a mass production environment. Illustrated FPGA device 401 is one of a mass production stream of like-manufactured devices that are provided either as part of an exposed set of dice on wafers that are being tested in a final wafer-sort facility or as packaged IC devices that are being tested in a post-packaging test facility. Prober 402 is correspondingly either a wafer-sort probe head that comes down into contact with an under-test FPGA die (401) or a test socket which comes into interfacing contact with an under-test and packaged IC device (401). In a mass production facility, users want the probing time to be reduced to as small a time as possible while still being able to validate the operability of the device under-test 401. This helps to maximize the number of devices per hour that can be tested in the test facility. Users also want the cost of the testing equipment to be as small as possible so that many such test platforms can be purchased economically and used in parallel for further increasing facility feedthrough rates.

The illustrated computerized testing system 400 includes a low cost computer coupled to the prober 402. This computer typically includes a display monitor 410, a computer housing 420, a keyboard 430 and a mouse 440. User input and output devices 410, 430 and 440 are merely examples. Other to-user output devices and from-user input devices may, of course, be used in addition to or in place of the illustrated peripherals.

Display monitor 410 includes a display screen 411 that can display a number of graphical items including a desktop layer and overlying windows generated by an opened application window 414. (Reference numbers that are braced by dashes are not part of what is displayed on the screen 411.) In the illustrated example, the opened application window 414 contains information belonging to a running simulation program 465 (FIG. 4B). A first subwindow 426 may show one or more test status reports including the 'expected' set of 'read-out' states 421 for a given sequencer and the actual 'read-out' states 422 obtained for that sequencer. One or more, on-screen mismatch pointers such as 423 may respectively show where a 'readout' state (422) does not match, or stops matching with the 'expected' state (421). Another part, 424 of first subwindow 426 may identify a particular one of plural tests as being the one for which the displayed results 422 apply. Identification may be by way of test number (nn) or by other identification techniques. Another part, 425 of first subwindow 426 may identify a particular one or more of plural sequencers as being the one or ones for which the displayed results 422 apply. Identification may be by way of sequencer number (mm) or by other identification techniques.

Once one or more mismatch states (423) are associated with a specific test (424) and specific one or more in-chip sequencers (425) of the under-test device 401, analysis software (465, FIG. 4B) may be used to provide best guesses as to what the likely types and/or locations of defects might be that resulted in the observed mismatch(es) 423. A second subwindow 428 may display the best guesses of likely types and/or locations of defects as a list or in other suitable formats (e.g., mapped in a floor plan of the chip/wafer 401). Icon 427 is meant to represent the time consumed and computational resources used by the verification and analysis programs 465 from the time the prober 402 makes contact with a next chip 401 until the result data 428 is produced. As already explained, it is desirable to minimize the time and to minimize the cost of the testing hardware.

Referring now to FIG. 4B, a possible method for interconnecting components of computer system 400 is shown schematically. Computer system 400 may include a central processing unit (CPU) 450 or other data processing means (e.g., plural processors), and a system memory 460 for storing immediately-executable instructions and immediately-accessible data for the CPU 450 or other processors. System memory 460 typically takes the form of DRAM (dynamic random access memory) and cache SRAM (static random access memory). Other forms of such high-speed memory may also be used. A system bus 455 may be used to operatively interconnects the CPU 450 and the system memory 460.

The computerized testing system 400 may further include non-volatile mass storage means 470 such as a magnetic hard disk drive, a floppy drive, a CD-ROM drive, a re-writeable optical drive, or the like that is operatively coupled to the system bus 455 for transferring instructions and/or data over bus 455. Instructions for execution by the CPU 450 (or other processors) may be introduced into system 400 by way of computer-readable media 475 such as a floppy diskette or a CD-ROM optical platter or other like, instructing devices adapted for operatively coupling to, and providing instructions and/or data for operative use by the CPU 450 (or an equivalent instructable machine) The computer-readable media 475 may define a device for coupling to, and causing system 400 to perform operations in accordance with the present invention as described herein.

System 400 may further include input/output (I/O) means 480 for providing interfacing between system bus 455 and peripheral devices such as display 410, keyboard 430 and mouse 440. The I/O means 480 may further provide interfacing to a communications network 490 such as an Ethernet network, a SCSI network, a telephone network, a cable system, a wireless link system or the like. Instructions for execution by the CPU 450 and/or data structures for use by the CPU 450 may be introduced into system 400 by way of data signals transferred over communications network 490. Communications network 490 may therefore define a means for coupling to, and causing system 400 to perform operations in accordance with the present invention. The instructing signals and/or data signals that are transferred through the communications network 490 for causing system 400 to perform said operations may also be manufactured and structured in accordance with the present invention.

System memory 460 may hold executing portions 461 of an operating system (OS) and of any then-executing parts of application programs 465. The application programs 465 generally communicate with the operating system by way of an API (application program interface) 461*a*. One of the application programs 465 may be an FPGA configuring and testing program structured to cause the FPGA to self-test itself in accordance with the invention described herein. System memory 460 may include various data structures for causing computer system 400 to perform various operations in accordance with the present invention as described herein.

Although the embodiment of FIG. 4A is described as providing a single station 400 for both configuring supplied FPGA's (401) for self-testing of themselves and for reading out the self-test results 422 and for comparing (423) the readout results against expected results (421), it is within the contemplation of the invention to carry out such steps serially at two or more stations rather than all in one place. In other words, a first station may simultaneously and in-parallel program a large batch of FPGA's to run a respective first test. A plurality of next stations may individually probe the FPGA die/IC packages 401 and cause them to execute the first test while collected the readout states at appropriate pause points. A third machine may collect test results, analyze them, and provide test-result reports. A wide variety of modifications are possible to the basic theme.

Various further modifications and variations in accordance with the spirit of the above disclosure will become apparent to those skilled in the art after having read the foregoing. For example, the disclosed 4-LUT's of FIGS. 2A/3A can be used at different times for carrying out the AND/OR tree testing techniques of FIG. 1D and the sequential state machine testing techniques of FIG. 2A and/or 3A–3C. As another example, the longline drivers of the illustrated embodiment need not be tristate line drivers but instead may be other kinds of line driver such as an open collector line drivers. It is within the contemplation of the invention to provide within computer-readable media (e.g., floppy diskettes, CD-ROM, DVD-ROM) and/or within manufactured and transmitted signals, FPGA-configuring bit streams in accordance with the above disclosure and/or to provide computer-understandable instructions to computers for causing the computers to perform automated stepping of FPGA's under-test through a battery of reconfigurations and test loops and readouts in accordance with the above disclosure.

The above disclosure is therefore to be taken as illustrative of the invention, not as limiting its scope or spirit.

Given the above disclosure of general concepts and specific embodiments, the scope of protection sought is to be defined by the claims appended hereto.

What is claimed is:

1. A method of defining an interconnect-challenging sequence of unique sequencer states for testing the operability of a plurality of under-test, programmable interconnect resources (IRUT's) where said IRUT's are used to feedback a previously stored, sequencer state to inputs of a programmable sequencer for thereby producing, if the under-test IRUT's are in operative rather than defective condition, a next expected state of the programmable sequencer, said method comprising:

(a) organizing the expected sequence of unique sequencer states so as to avoid toggling a first challenging signal applied to a corresponding first of the under-test IRUT's only at a relatively low toggling frequency and to simultaneously avoid toggling a second challenging signal applied to a corresponding second of the under-test IRUT's only a substantially higher toggling frequency.

2. The sequence defining method of claim 1 and further comprising:

(b) organizing the expected sequence of unique sequencer states so as to substantially avoid toggling said first and second, challenging signals each independently of previous states of the other.

3. The sequence defining method of claim 1 and further comprising:

(b) organizing the expected sequence of unique sequencer states so as to define for each of the challenging signals a substantially pseudo-random pattern of level changes whose respective next-state value often depends heavily on current-state values of the others of the IRUT challenging signals.

4. The sequence defining method of claim 3 wherein there are at least 4 independent IRUT's associated with a corresponding 4 IRUT challenging signals and a hexadecimally denoted description of the expected sequence of unique sequencer states provides the following, wrap-aroundable, ordered set of states: 0, 6, 9, F, 3, A, 5, 7, E, 8, B, 1, 4, 2, C, D or a reverse time ordered counterpart thereof starting at any position within the wrap-aroundable order.

5. The sequence defining method of claim 3 wherein said organizing of the expected sequence of unique sequencer states is clocked and defines for high and low levels of each of the challenging signals:

(b.1) at least one 1-clock pulse long high, one 2-clock pulses long high, one 1-clock pulse long low, and one 2-clock pulses long low.

6. The sequence defining method of claim 5 wherein said organizing of the expected sequence of unique sequencer states further defines for one or more of the challenging signals:

(b.2) at least one 3-clock pulses long high or at least one 3-clock pulses long low.

7. The sequence defining method of claim 6 wherein said organizing of the expected-sequence of unique sequencer states further defines for one or more of the challenging signals:

(b.3) at least one 4-clock pulses long high or at least one 4-clock pulses long low.

8. The sequence defining method of claim 5 wherein said organizing of the expected sequence of unique sequencer states further defines for one or more of the challenging signals:

(b.2) at least one 4-clock pulses long high or at least one 4-clock pulses long low.

9. The sequence defining method of claim 1 wherein said expected sequence of unique sequencer states is defined as part of a battery of different expected sequences, and the battery of IRUT challenging sequences provides a substantially uniform distribution over time of high frequency and low frequency stressing of the programmable interconnect resources (IRUT's) for differently programmed interconnect configurations using the programmable IRUT's.

10. The sequence defining method of claim 1 wherein there are at least 4 independent IRUT's associated with a corresponding 4 IRUT challenging signals and a hexadecimally denoted description of the expected sequence of unique sequencer states provides the following, wrap-aroundable, ordered set of states: 0, 1, 2, 3, 4, 5, 6, 7, 8, C, A, E, 9, D, B, F or a reverse time ordered counterpart thereof starting at any position within the wrap-aroundable order.

11. The sequence defining method of claim 1 and further comprising:
  (c) identifying a set of readout points defined by a subset of the organized expected sequence of unique sequencer states so that fault detection may occur by reading out substantially less than all the states of the sequencer.

12. A re-programmably programmed sequencer that uses a plurality of under-test, programmable interconnect resources (IRUT's) to feedback previously stored, sequencer states to inputs of the sequencer for thereby producing, if the under-test IRUT's are in operative rather than in a faulty condition, an expected interconnect-challenging sequence of unique sequencer states for testing the operability of a plurality of under-test, programmable interconnect resources (IRUT's), where said re-programmably programmed sequencer is programmed to:
  (a) define the expected sequence of unique sequencer states as one which avoids toggling a first challenging signal applied to a corresponding first of the under-test IRUT's only at a relatively low toggling frequency and simultaneously avoids toggling a second challenging signal applied to a corresponding second of the under-test IRUT's only a substantially higher toggling frequency.

13. A manufactured instructing signal which is loadable into an FPGA for defining in the FPGA, a re-programmably programmed sequencer that uses a plurality of under-test, programmable interconnect resources (IRUT's) to feedback previously stored, sequencer states to inputs of the sequencer for thereby producing, if the under-test IRUT's are in operative rather than in a faulty condition, an expected interconnect-challenging sequence of unique sequencer states for testing the operability of a plurality of under-test, programmable interconnect resources (IRUT's), where said re-programmably programmed sequencer is programmed to:
  (a) define the expected sequence of unique sequencer states as one which avoids toggling a first challenging signal applied to a corresponding first of the under-test IRUT's only at a relatively low toggling frequency and simultaneously avoids toggling a second challenging signal applied to a corresponding second of the under-test IRUT's only a substantially higher toggling frequency.

14. A manufactured instructing signal which is loadable into an instructable computing machine for causing the computing machine to carry out an interconnect verification operation which includes the formation within an under-test FPGA of a programmed sequencer that uses a plurality of under-test, programmable interconnect resources (IRUT's) to feedback previously stored, sequencer states to inputs of the sequencer for thereby producing, if the under-test IRUT's are in operative rather than in a faulty condition, an expected interconnect-challenging sequence of unique sequencer states for testing the operability of a plurality of under-test, programmable interconnect resources (IRUT's), where said re-programmably programmed sequencer is programmed to:
  (a) define the expected sequence of unique sequencer states as one which avoids toggling a first challenging signal applied to a corresponding first of the under-test IRUT's only at a relatively low toggling frequency and simultaneously avoids toggling a second challenging signal applied to a corresponding second of the under-test IRUT's only a substantially higher toggling frequency.

* * * * *